(12) United States Patent
Tsukao et al.

(10) Patent No.: US 10,899,949 B2
(45) Date of Patent: Jan. 26, 2021

(54) FILLER-CONTAINING FILM

(71) Applicant: DEXERIALS CORPORATION, Tokyo (JP)

(72) Inventors: Reiji Tsukao, Utsunomiya (JP); Makoto Matsubara, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/345,043

(22) PCT Filed: Oct. 13, 2017

(86) PCT No.: PCT/JP2017/037137
§ 371 (c)(1),
(2) Date: Apr. 25, 2019

(87) PCT Pub. No.: WO2018/079303
PCT Pub. Date: May 3, 2018

(65) Prior Publication Data
US 2019/0276709 A1    Sep. 12, 2019

(30) Foreign Application Priority Data

Oct. 31, 2016  (JP) ................................ 2016-213298
Aug. 22, 2017  (JP) ................................ 2017-159828

(51) Int. Cl.
*C09J 7/30*    (2018.01)
*C09J 9/00*    (2006.01)
(Continued)

(52) U.S. Cl.
CPC .................. *C09J 7/30* (2018.01); *B32B 7/12* (2013.01); *C08K 3/013* (2018.01); *C09J 9/00* (2013.01);
(Continued)

(58) Field of Classification Search
CPC ....... C09J 7/30; C09J 9/00; C09J 11/04; C09J 2201/128; C09J 2203/326; C09J 2205/102;
(Continued)

(56) References Cited

U.S. PATENT DOCUMENTS

2006/0280912 A1* 12/2006 Liang ...................... H01B 1/24
                                                   428/173
2012/0037399 A1    2/2012 Hsiao et al.
2017/0103959 A1*  4/2017 Akutsu ................... H01B 1/22

FOREIGN PATENT DOCUMENTS

JP    H08-124435 A    5/1996
JP    2002-519473 A   7/2002
(Continued)

OTHER PUBLICATIONS

Mar. 20, 2019 International Preliminary Report on Patentability issued in International Application No. PCT/JP2017/037137.
(Continued)

*Primary Examiner* — Karen Kusumakar
(74) *Attorney, Agent, or Firm* — Oliff PLC

(57) ABSTRACT

An anisotropic conductive film or other filler-containing film 10A of the present invention includes a filler dispersed-layer 3 including a resin layer 2, a first filler layer with a filler 1A dispersed in a single layer in the resin layer 2, and a second filler layer with a filler 1B dispersed in a single layer in the resin layer 2 at a depth different from the depth of the first filler layer. The filler 1A of the first filler layer is exposed from one surface 2a of the resin layer 2, or is in close proximity to the surface 2a, and the filler 1B of the second filler layer is exposed from the other surface 2b of the resin layer 2, or is in close proximity to the surface 2b.

17 Claims, 9 Drawing Sheets

(51) Int. Cl.
*C09J 11/04* (2006.01)
*H01L 23/00* (2006.01)
*C08K 3/013* (2018.01)
*B32B 7/12* (2006.01)

(52) U.S. Cl.
CPC ............... *C09J 11/04* (2013.01); *H01L 24/32* (2013.01); *H01L 24/83* (2013.01); *C08K 2201/005* (2013.01); *C09J 2203/326* (2013.01); *C09J 2301/124* (2020.08); *C09J 2301/408* (2020.08); *C09J 2461/00* (2013.01); *C09J 2463/00* (2013.01); *H01L 2224/3223* (2013.01); *H01L 2224/83203* (2013.01); *H01L 2224/83851* (2013.01)

(58) Field of Classification Search
CPC ...... C09J 2461/00; C09J 2463/00; C09J 7/00; C09J 7/22; C09J 9/02; C08K 3/013; C08K 2201/005; B32B 7/12; H01L 24/32; H01L 24/83; H01L 2224/3223; H01L 2224/83203; H01L 2224/83851; H01L 24/27; H01L 24/29; H01L 2224/32225; H01L 2224/32145; H01R 11/01; H01R 43/00; C08J 5/18
See application file for complete search history.

(56) References Cited

FOREIGN PATENT DOCUMENTS

| | | |
|---|---|---|
| JP | 2006-15680 A | 1/2006 |
| JP | 2009-16133 A | 1/2009 |
| JP | 2013-103368 A | 5/2013 |
| JP | 2014-060150 A | 4/2014 |
| JP | 2014-183266 A | 9/2014 |
| JP | 2015-138904 A | 7/2015 |
| JP | 2015-201435 A | 11/2015 |
| JP | 2016-31888 A | 3/2016 |
| JP | 2017-73389 A | 4/2017 |

OTHER PUBLICATIONS

Jan. 9, 2018 International Search Report issued in International Patent Application PCT/JP2017/037137.

Jan. 9, 2018 Written Opinion issued in International Patent Application PCT/JP2017/037137.

Oct. 30, 2018 Written Opinion of the International Preliminary Examining Authority issued in International Patent Application PCT/JP2017/037137.

\* cited by examiner (X-X CROSS-SECTIONAL VIEW)

(X-X CROSS-SECTIONAL VIEW)

FILLER-CONTAINING FILM

TECHNICAL FIELD

The present invention relates to a filler-containing film such as an anisotropic conductive film.

BACKGROUND ART

Filler-containing films that have a filler dispersed in a resin layer are used in a wide range of applications such as in matte films, capacitor films, optical films, label films, antistatic films, and anisotropic conductive films (Patent Document 1, Patent Document 2, Patent Document 3, and Patent Document 4).

As one aspect of a filler-containing film, for example, anisotropic conductive films are widely used in the mounting of IC chips and other electronic components. From the perspective of configuring an anisotropic conductive film to support a high mounting density, conductive particles are dispersed with a high density in an insulating resin layer of the anisotropic conductive film. However, when the number density of the conductive particles is too high, a short circuit easily occurs in the connection structure of the electronic components that use the anisotropic conductive film.

In contrast, in the manufacturing of an anisotropic conductive film, a method is proposed in which a coating roll including regular grooves in the surface of a gravure coater or such is used, a resin solution containing conductive particles is coated onto an insulating resin layer or a release film, and the conductive particles are regularly arranged in a single layer in the insulating resin layer (Patent Document 5). A method is also proposed in which conductive particles dispersed in a prescribed disposition using a transfer mold are transferred respectively to a first insulating resin layer and a second insulating resin layer, the first insulating resin layer and second insulating resin layer to which the conductive particles were transferred are bonded together, and a first conductive particle layer and a second conductive particle layer in which conductive particles are regularly arranged are formed at different depths of an anisotropic conductive film (Patent Document 6).

CITATION LIST

Patent Literature

Patent Document 1: JP 2006-15680 A
Patent Document 2: JP 2015-138904 A
Patent Document 3: JP 2013-103368 A
Patent Document 4: JP 2014-183266 A
Patent Document 5: JP 2016-31888 A
Patent Document 6: JP 2015-201435 A

SUMMARY OF INVENTION

Technical Problem

According to the method for manufacturing an anisotropic conductive film described in Patent Document 5, conductive particles are regularly arranged, and therefore even if the number density of the conductive particles is increased, the ease of occurrence of short circuits is reduced in comparison to a case in which the conductive particles are randomly disposed. However, because the conductive particles are disposed in a single layer on one side of the anisotropic conductive film, there are limits to the ability to precisely arrange the conductive particles so that short circuits do not easily occur when the number density is increased.

According to the method for manufacturing an anisotropic conductive film described in Patent Document 6, conductive particles are retained in each of the first insulating resin layer and the second insulating resin layer, and therefore the number density of conductive particles in terms of the overall anisotropic conductive film is increased, and the occurrence of short circuits can be suppressed. However, in accordance with the method described in Patent Document 6 for manufacturing an anisotropic conductive film, a curable resin is used in the first insulating resin layer and the second insulating resin layer, and through the curing thereof, the conductive particles are retained in these resin layers, and when the first insulating resin layer and the second insulating resin layer are bonded together, there is a possibility that the tackiness of the surface of the anisotropic conductive film decreases, and operability also decreases when temporary bonding is implemented to bond the anisotropic conductive film to an electronic component, or when temporary pressure bonding is implemented to fix the anisotropic conductive film to the electronic component through low temperature pressure bonding.

In contrast, an object of the present invention is to configure a filler-containing film such as an anisotropic conductive film to include a first filler layer and a second filler layer at different depths to thereby increase the number density of the filler and enable improvements in functionality (for example, to support high density mounting). More specifically, for a case in which a filler-containing film is configured as an anisotropic conductive film, the present invention addresses the issues of suppressing the occurrence of short circuits in a connection structure between electronic components, improving the connection reliability, and furthermore, imparting tackiness to a film surface to improve operability with respect to temporarily bonding and temporarily pressure bonding the filler-containing film such as an anisotropic conductive film.

Solution to Problem

The inventors of the present invention discovered that for a case particularly in which an anisotropic conductive film, which is one aspect of a filler-containing film, when manufacturing a filler-containing film for which the occurrence of short circuits is suppressed, the filler-containing film is configured, while increasing the number density of a filler by providing a first filler layer and a second filler layer at different depths of a resin layer, to provide the first filler layer to be exposed from one surface of the resin layer or in the vicinity of the one surface, and provide the second filler layer to be exposed from the other surface of the resin layer or in the vicinity of the other surface by pushing the filler into both the front and rear surfaces of the resin layer, therefore conductive particles are more easily captured by terminals of electronic components that are connected in an anisotropic conductive manner, connection reliability is improved, and tackiness of the film surface is easily ensured, and the inventors thereby arrived at the present invention. By providing fillers in both surfaces in this manner, performance of the filler-containing film is imparted and improved, and contributions can be made to quality stability and cost reductions.

Specifically, the present invention provides a filler-containing film including a filler dispersed-layer including, a resin layer, a first filler layer including a filler dispersed in a single layer in the resin layer, and a second filler layer including a filler dispersed in a single layer in the resin layer at a depth different from the depth of the first filler layer, wherein the filler of the first filler layer is exposed from one surface of the resin layer, or is in close proximity to the one surface, and the filler of the second filler layer is exposed from the other surface of the resin layer, or is in close proximity to the other surface. In particular, as a preferable aspect of the present invention, a filler-containing film for which the filler is conductive particles, the resin layer is an insulating resin layer, and the filler-containing film is used as an anisotropic conductive film, is provided.

The present invention also provides a method for manufacturing the above-described filler-containing film, the method including, retaining the filler in a prescribed dispersed state on one surface of the resin layer, pushing the filler into the resin layer, retaining the other filler in a prescribed dispersed state on another surface of the resin layer, and pushing the other filler into the resin layer.

The present invention also provides a film adhered body that is an article to which the above-described filler-containing film is adhered, a connection structure connecting a first article and a second article via the above-described filler-containing film, and particularly a connection structure in which a first electronic component and a second electronic component are connected in an anisotropic conductive manner via a filler-containing film that is used as an anisotropic conductive film. The present invention further provides a method for manufacturing a connection structure by pressure bonding the first article and the second article via the above-described filler-containing film, and a method for manufacturing a connection structure by using the first electronic component and the second electronic component for each of the first article and the second article, and thermocompression bonding the first electronic component and the second electronic component via a filler-containing film, which is used as an anisotropic conductive film, to manufacture a connection structure, in the connection structure the first electronic component and the second electronic component are connected in an anisotropic conductive manner.

Advantageous Effects of Invention

According to an anisotropic conductive film, which is one aspect of the filler-containing film of the present invention, the filler is exposed from each of the front and rear surfaces of the resin layer, or is present in close proximity to the surfaces, and therefore when the filler-containing film is configured as an anisotropic conductive film, conductive particles are easily captured by terminals of electronic components that are connected in an anisotropic conductive manner. Accordingly, connection reliability is improved.

Furthermore, the number density of the first filler layer and the number density of the second filler layer are both lower than the number density of the filler of the overall film. Therefore, even if the filler is present at a high density in the overall film, the possibility of decreasing in the tackiness of the film surface as a result of the high density can be avoided. Furthermore, according to an anisotropic conductive film or other filler-containing film of the present invention, the resin layer does not need to be cured to fix the filler in the resin layer, and therefore tackiness of the film surface can be ensured through this as well. In addition to an improvement in tackiness, an imparting of functionality that differs from a case in which the filler is provided only at one surface can be anticipated by providing the filler at both surfaces rather than only at one surface of the filler-containing film.

In addition, by setting the number density of the first filler layer and the number density of the second filler layer to be respectively lower than the number density of the filler of the overall film, precisely controlling the disposition of the filler in each filler layer is facilitated, and the fillers can be precisely disposed in a prescribed disposition even if the disposition pitch of the filler is narrow as in an overall anisotropic conductive film or other filler-containing film. Thus, coupled with an improvement in the above-described capturing performance, the filler-containing film is also suited for fine pitch connections, and for example, can be used in the connection of electronic components with a terminal width from 6 μm to 50 μm and a space between terminals from 6 μm to 50 μm. Furthermore, in a case where the effective connection terminal width (of the width of a pair of terminals that are opposing when making a connection, the width of the overlapping portion in a plan view) is 3 μm or greater, and the shortest distance between terminals is 3 μm or greater, the electronic components can be connected without causing a short circuit. Another aspect includes, for example, an optical film, and the optical performance of the filler can be adjusted by adjusting a quantity percentage of fillers that are non-contacting and independent in a plan view and in the thickness direction of the resin layer. The same can be said for films that are directly connected to external appearance such as matte films. The quantity percentage of the filler can be adjusted at both sides, and therefore easily contributes to improving performance and quality and to cost reductions.

DESCRIPTION OF EMBODIMENTS

Figure 1A:
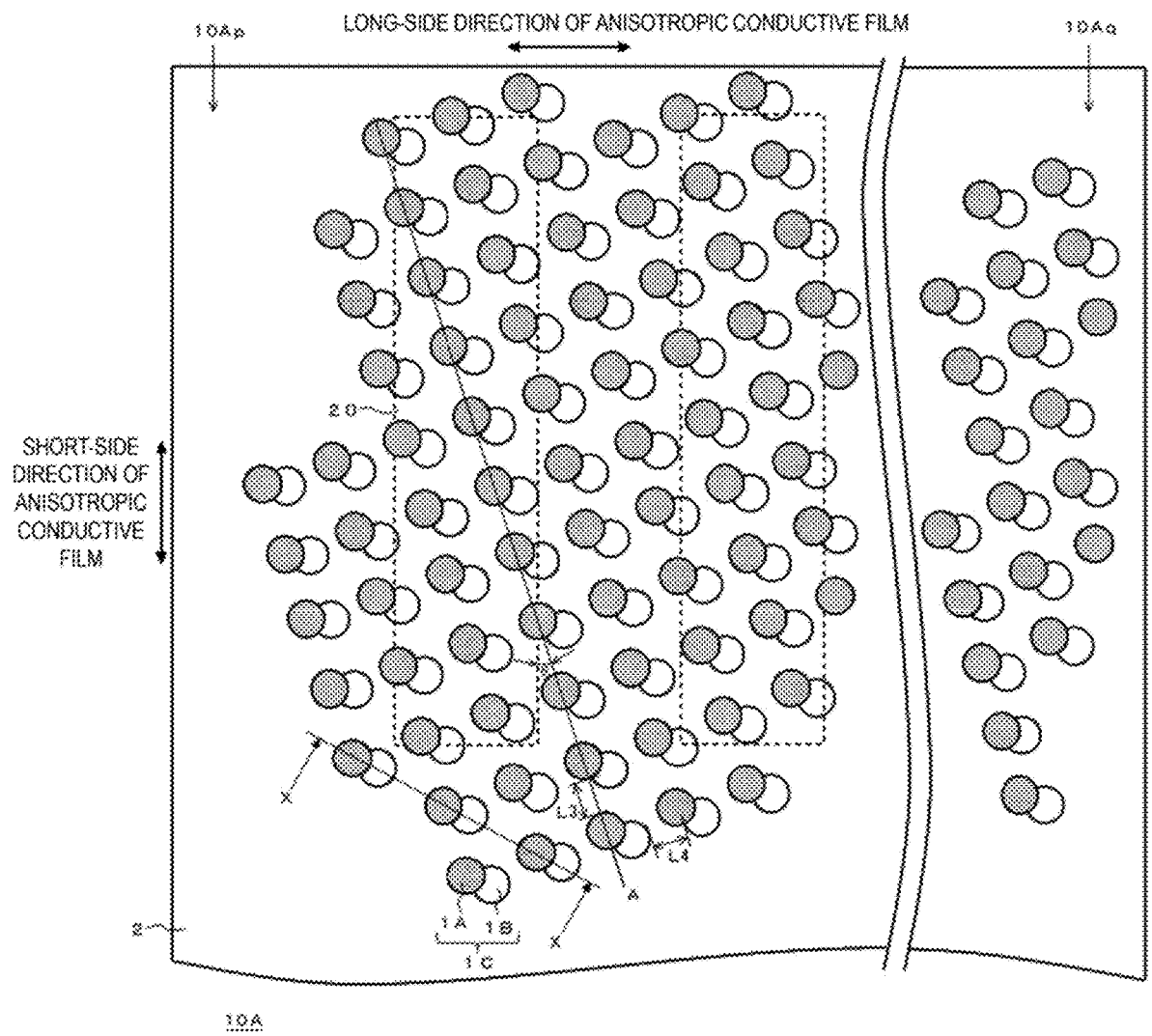
FIG. 1A is a plan view illustrating the disposition of fillers (conductive particles) in a filler-containing film (an anisotropic conductive film, which is one aspect thereof) 10A of an embodiment.

A filler-containing film of the present invention will be described in detail below with reference to the drawings using primarily an anisotropic conductive film, which is one aspect thereof. Note that in the drawings, identical reference signs indicate the same or equivalent constituents.

Overall Configuration of the Filler-Containing Film

Figure 1B:
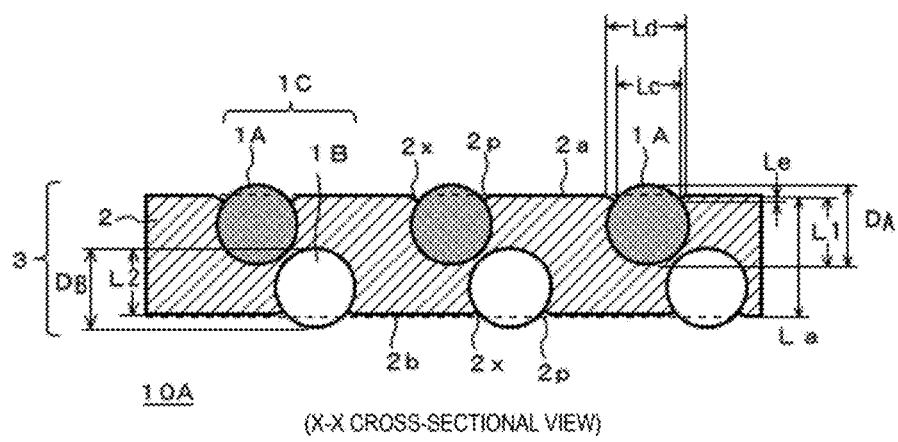
FIG. 1B is a cross-sectional view of the filler-containing film 10A of the embodiment.

FIG. 1A is a plan view describing the filler disposition in the filler-containing film 10A as one embodiment of the present invention, and FIG. 1B is a cross-sectional view along the line X-X thereof.

The filler-containing film 10A is made from a filler dispersed-layer 3 that is formed with, a resin layer 2, a first filler layer made from a filler 1A dispersed in a single layer at a prescribed depth from one surface 2a of the resin layer 2 in a thickness direction of the film, and a second filler layer made from a filler 1B dispersed in a single layer at a depth that differs from that of the first filler layer. The filler 1A of the first filler layer is unevenly distributed to the one surface 2a side of the resin layer 2, and exposed from the surface 2a, and the filler 1B of the second filler layer is unevenly distributed to the other surface 2b side of the resin layer 2, and exposed from the surface 2b. Note that in the drawings, the filler 1A of the first filler layer is indicated by a deep color, and the filler 1B of the second filler layer is indicated in white.

Unless otherwise noted, the dispersion state of the filler in the present invention includes a state in which the fillers 1A and 1B are randomly dispersed, as well as a state in which the fillers 1A and 1B are dispersed in a regular disposition.

Also, with the filler-containing film 10A of the present embodiment, in a long-side direction of the film, the number density of the filler 1A of the first filler layer or the number density of the filler 1B of the second filler layer increases gradually, and the number density of the other decreases gradually, and uniformity of the number densities of the fillers 1A and 1B in the overall film with the first filler layer and the second filler layer combined is excellent.

Filler

The fillers 1A and 1B are selected, as appropriate, according to the application of the filler-containing film and according to the hardness, optical performance or other performances required in the application, from well-known inorganic fillers (metal, metal oxides, metal nitrides, etc.), organic fillers (resin particles, rubber particles, etc.), and fillers obtained by mixing an organic material and an inorganic material (for example, particles including a core formed from a resin material and a surface being metal plated (metal-coated resin particles), fillers for which insulating microparticles are adhered to the surface of conductive particles, and fillers for which the surface of conductive particles has been subjected to an insulating treatment, etc.). For example, silica fillers, titanium oxide fillers, styrene fillers, acrylic fillers, melamine fillers and various titanates, etc. can be used with optical films and matte films. With capacitor films, titanium oxide, magnesium titanate, zinc titanate, bismuth titanate, lanthanum oxide, calcium titanate, strontium titanate, barium titanate, barium zirconate titanate, lead zirconate titanate, and mixtures of these can be used. With adhesive films, polymer-based rubber particles and silicone rubber particles, etc. can be contained. With anisotropic conductive films, conductive particles are contained. Examples of conductive particles include particles of metals such as nickel, cobalt, silver, copper, gold, or palladium, particles of alloys such as solder, metal-coated resin particles, and metal-coated resin particles with insulating microparticles adhered to the surface. A combination of two or more may also be used. Of these, metal-coated resin particles are preferable from the perspective of stabilizing conduction performance because after connection, contact with the terminals is easily maintained by the repulsion of the resin particles. Furthermore, the surface of the conductive particles may be subjected to an insulation treatment that does not impede the conduction property using a well-known technology. The fillers described above as examples by application are not limited to the above-mentioned applications, and as necessary, may be contained by a filler-containing film of another application. Furthermore, with the filler-containing films of each application, two or more types of fillers can be used in combination as necessary.

In accordance with the application of the filler-containing film, the shape of the filler is selected and stipulated, as appropriate, from shapes such as a spherical shape, an elliptical shape, a columnar shape, a needle shape, and combinations thereof. A spherical shape is preferable from the perspectives of ease of confirming the filler disposition, and ease of maintaining a uniform state. In particular, when the filler-containing film is configured as an anisotropic conductive film, the conductive particles, which are the filler, are preferably roughly spherical. When an anisotropic conductive film in which the conductive particles are arranged using a transfer mold as disclosed in JP 2014-60150 A is manufactured using roughly spherical conductive particles as the conductive particles, for example, the conductive particles can roll smoothly on the transfer mold. Consequently, the conductive particles can be loaded at predetermined positions on the transfer mold with high precision. Thus, the conductive particles can be precisely disposed.

To accommodate variations in wiring height, suppress an increase in conduction resistance, and suppress the occurrence of short circuits, particle diameters DA and DB of the fillers 1A and 1B are preferably from 1 µm to 30 µm, and more preferably from 3 µm to 9 µm.

The particle diameter of the filler 1A of the first filler layer and the particle diameter of the filler 1B of the second filler layer may be the same or different. For cases in which the filler-containing film is configured as an anisotropic conductive film, the compressed states of both of the fillers 1A and 1B, which are conductive particles (particularly metal-coated resin particles), such as the flatness ratio after connection in an anisotropic conductive manner, are made the same. Setting the compressed states to be the same is preferable from the perspective of stabilizing conduction performance. Moreover, the materials and hardness (for example, the compressive elasticity modulus) of the filler 1A and the filler 1B may be the same or different.

The particle diameter of the fillers 1A and 1B can be measured using a common particle diameter distribution analyzer, and the average particle diameter can also be determined using the particle diameter distribution analyzer. An example of this type of measurement device is the FPIA-3000 (from Malvern Panalytical Ltd.). The filler diameter in the film can be determined through observation with a metallurgical microscope, or observation with an electron microscope such as an SEM. In this case, the number of samples for which the filler diameter is to be measured is desirably set to 200 or more. Furthermore, for cases in which the filler shape is not spherical, the maximum length based on a planar image or cross-sectional image of the filler-containing film, or the diameter of a shape that mimics a sphere can be used as the particle diameter of the filler.

Filler Position in the Film Thickness Direction

With regard to the position of the fillers 1A and 1B in the film thickness direction, FIG. 1B illustrates an aspect in which the filler 1A of the first filler layer is exposed from one surface 2a of the resin layer 2, and the filler 1B of the second filler layer is exposed from the other surface 2b. However, the present invention also includes an aspect in which the filler 1A of the first filler layer is exposed from the one surface 2a of the resin layer 2, or the filler 1A is fully embedded in the resin layer 2, but is located at a position that is in close proximity to the surface 2a of the resin layer 2, and the filler 1B of the second filler layer is exposed from the other surface 2b of the resin layer 2, or the filler 1B of the second filler layer is fully embedded in the resin layer 2, but is located at a position that is in close proximity to the surface 2b of the resin layer 2. Here, the matter of the fillers 1A and 1B being fully embedded in the resin layer 2, but being positioned in close proximity to the respective surfaces 2a and 2b refers, for example, to a case in which the fillers 1A and 1B are not exposed from the resin layer 2, and a below-described embedding percentage is 110% or less, and preferably 105% or less. When the fillers 1A and 1B are exposed from the surfaces 2a and 2b of the resin layer 2, the particle diameters of the fillers 1A and 1B may be the same or different. The filler-containing film is preferably configured as an anisotropic conductive film because with such a configuration, when an anisotropic conductive connection is made, the capturing performance of the fillers 1A and 1B, which are conductive particles, is remarkably improved. Moreover, when the fillers 1A and 1B are embedded into the resin layer 2, and are in close proximity to the surfaces 2a and 2b, the tackiness of the filler-containing film is improved without impairing the capturing performance of the fillers 1A and 1B, and thus such a configuration is preferable. In particular, the fillers 1A and 1B are preferably in close proximity to the respective surfaces 2a and 2b of the resin layer 2 by a distance of less than 0.1 µm because at such distances, the capturing performance of the fillers 1A and 1B is improved without impairing the tackiness. Furthermore, the filler layers with a filler number density of 5000 particles/mm$^2$ or greater or an area occupancy ratio of 2% or greater are preferably flush with the respective surfaces 2a and 2b of the resin layer 2 with the fillers 1A and 1B being embedded into the resin layer 2. Through this, compared to a case in which the fillers are exposed from the resin layer, the tackiness of the filler-containing film does not decrease, and compared to a case in which the embedding percentage exceeds 100% and the fillers are fully embedded, with a case in which the filler-containing film is configured as an anisotropic conductive film, the fillers, which are conductive particles, are not easily affected by resin flow when an anisotropic conductive connection is made, and capturing performance is improved. In contrast, when either the first filler layer or the second filler layer is not exposed from the resin layer 2 and is not positioned in close proximity to the respective surface 2a or 2b of the resin layer 2, when the filler-containing film is configured as an anisotropic conductive film, there is a concern that the fillers, which are conductive particles, could be easily affected by resin flow when an anisotropic conductive connection is made, and capturing performance could decrease. Or, there is also a concern that it could be difficult to uniformly remove resin in the vicinity of the filler, and thereby pushing in of the fillers could be negatively affected. The same can be said with respect to filler-containing films besides anisotropic conductive films.

The embedding percentage, which is a ratio L1/DA of a distance (hereinafter, referred to as an embedded amount) L1 from a tangent plane of the surface 2a of the resin layer 2 at an intermediate portion of adjacent fillers 1A in the first filler layer to a deepest part of the filler 1A, to a particle diameter DA of the filler 1A, is preferably from 30% to 110%, more preferably from 30% to 105%, even more preferably greater than 30% to not greater than 100%, and particularly preferably from 60% to 100%. Similarly, with regard to the filler 1B of the second filler layer as well, the embedding percentage, which is a ratio L2/DB of a distance (embedded amount) L2 from a tangent plane of the surface 2b of the resin layer 2 at an intermediate portion of adjacent fillers 1B to a deepest part of the filler 1B, to a particle diameter DB of the filler 1B, is preferably from 30% to 110%, more preferably from 30% to 105%, even more preferably greater than 30% to not greater than 100%, and particularly preferably from 60% to 100%. Setting the embedding percentages L1/DA and L2/DB to 30% or greater facilitates the ability to maintain the fillers 1A and 1B in a prescribed regular disposition or a prescribed arrangement using the resin layer 2, and when the embedding percentages thereof are set to not greater than 110% and preferably not greater than 105%, for a case in which the filler-containing film is configured as an anisotropic conductive film, it becomes more difficult to cause the fillers, which are conductive particles, between terminals to flow unnecessarily due to resin flow when an anisotropic conductive connection is made. Furthermore, an effect of improving the characteristics of a filler-containing film can be anticipated by making the embedding percentage of the filler in the resin layer 2 of the filler-containing film uniform. As one example, for a case in which the performance of an optical film is dependent on the filler, in a case where regularity exists at a certain level or higher in the dispersiveness (independence) and embedding state in a plan view, it is surmised that performance improvements and quality stability can be obtained on a higher level in comparison to a film that is obtained by such as coating with a binder that is simply kneaded.

The embedding percentage of the filler 1A of the first filler layer and the embedding percentage of the filler 1B of the second filler layer may be the same or different.

Here, the filler diameters DA and DB are respectively average values of the filler diameters of the fillers 1A of the first filler layer and the fillers 1B of the second filler layer.

Furthermore, in the present invention, the numeric values of the embedding percentages L1/DA and L2/DB refer to cases in which 80% or greater, preferably 90% or greater, and more preferably 96% or greater of the total quantity of filler (for example, conductive particles) contained in the anisotropic conductive film or other filler-containing film is the numeric value for the embedding percentages L1/DA and L2/DB. The embedding percentages L1/DA and L2/DB can be determined by extracting areas with a surface area of 30 mm² or greater at 10 or more optional locations from an anisotropic conductive film or other filler-containing film, observing a portion of a cross section of the film thereof by using SEM images, and measuring 50 or more fillers in total. To further increase the precision, the embedding percentages may be determined by measuring 200 or more fillers.

Figure 2:
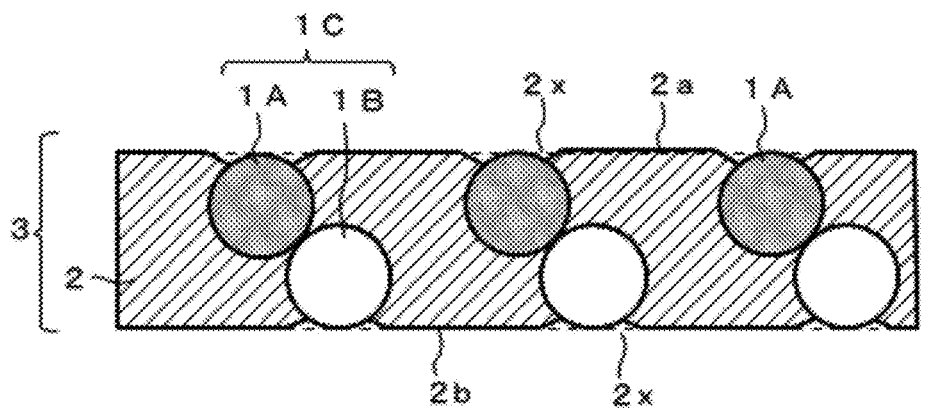
FIG. 2 is a cross-sectional view of a filler-containing film for which the embedding percentages of the filler of the first filler layer and the filler of the second filler layer are approximately 100%, and the fillers are exposed from the surface of the resin layer.

Examples of particularly preferable embedding aspects of the fillers 1A and 1B in the resin layer 2 include, as illustrated in FIG. 1B, an aspect in which the embedding percentages of both the fillers 1A and 1B are from 60% to 100%, the fillers 1A and 1B are exposed from the respective surfaces 2a and 2b of the resin layer 2, and a concave 2x is formed in the resin layer 2 around each of the exposed fillers 1A and 1B, and as illustrated in FIG. 2, an aspect in which the embedding percentages of both the fillers 1A and 1B are approximately 100%, the fillers 1A and 1B are flush with the respective surfaces 2a and 2b of the resin layer 2 at the front and rear of the resin layer 2, the fillers 1A and 1B are exposed from the respective surfaces 2a and 2b of the resin layer 2, and a concave 2x is formed in the resin layer 2 around each of the exposed fillers 1A and 1B. Through the formation of concaves 2x, for a case in which the filler-containing film is configured as an anisotropic conductive film, the resistance that is received from the resin with respect to flattening of the fillers 1A and 1B that occurs when the fillers 1A and 1B, which are conductive particles, are held between terminals when an anisotropic conductive connection is made, is reduced and the filler capturing performance at the terminals is improved in comparison to a case in which the concaves 2x are not present. Even as a filler-containing film, as described above, specificity exists in the filler and resin state, and therefore the occurrence of characteristics in performance and quality can be anticipated more so than with a film that is obtained by such as coating with a binder that is simply kneaded.

Figure 3:
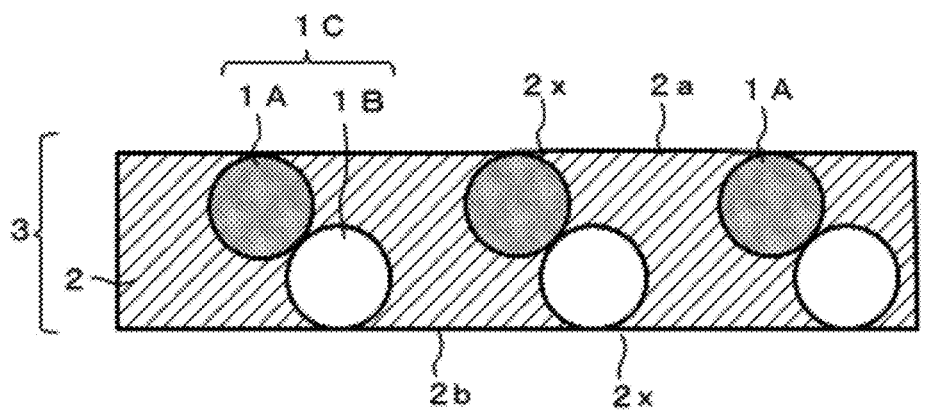
FIG. 3 is a cross-sectional view of a filler-containing film for which the embedding percentages of the filler of the first filler layer and the filler of the second filler layer are approximately 100%, and the fillers are embedded in the resin layer such that the surface of the resin layer is flat.

On the other hand, for a case in which the filler-containing film is configured as an anisotropic conductive film, when electronic components are to be connected using the anisotropic conductive film, from the perspective of configuring so that air is not incorporated therein, preferably, as illustrated in FIG. 3, the fillers 1A and 1B, which are conductive particles, are embedded into the resin layer 2 so that the embedding percentages of the fillers 1A and 1B are approximately 100%, and the surface of the filler dispersed-layer 3 is flat.

Figure 4:
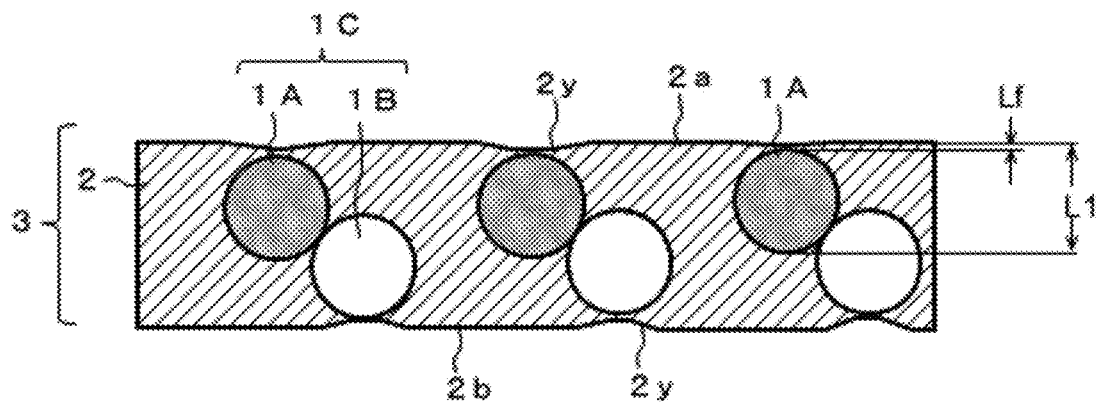
FIG. 4 is a cross-sectional view of a filler-containing film for which the embedding percentages of the fillers slightly exceed 100%, and concaves are present in the surface of the resin layer directly above the fillers.

Furthermore, in a case where the embedding percentages exceed 100%, preferably, as illustrated in FIG. 4, a concave 2y is formed in each area directly above the fillers 1A and 1B of the respective surfaces 2a and 2b of the resin layer 2, in close proximity to the fillers 1A and 1B. Through the formation of the concaves 2y, for a case in which the filler-containing film is configured as an anisotropic conductive film, the pressure when an anisotropic conductive connection is made is more easily concentrated on the fillers 1A and 1B, which are conductive particles, and the capturing performance of the fillers 1A and 1B at the terminals is improved in comparison to a case without the concaves 2y. Even as a filler-containing film, as described above, specificity exists in the filler and resin state, and therefore the occurrence of characteristics in performance and quality can be anticipated more so than with a film that is obtained by such as coating with a binder that is simply kneaded.

Filler Arrangement

The filler 1A of the first filler layer and the filler 1B of the second filler layer are respectively arranged in a square lattice in the filler-containing film 10A illustrated in FIG. 1A. The fillers 1A and 1B are preferably regularly arranged in this manner in the filler-containing film of the present invention. In addition to the square lattice illustrated in FIG. 1A, other examples of regular arrangements include a rectangular lattice, a rhombic lattice, a hexagonal lattice, and other lattice arrangements. Examples of regular arrangements besides a lattice arrangement include arrangements in which particle rows, in which fillers are aligned at a prescribed spacing in a straight line, are arranged in parallel with a prescribed spacing therebetween. By arranging the fillers 1A and 1B in a lattice form or other regular arrangement, for a case in which the filler-containing film is configured as an anisotropic conductive film, pressure can be evenly applied to each of the fillers 1A and 1B, which are conductive particles, when an anisotropic conductive connection is made, and variations in conduction resistance can be reduced.

Figure 5A:
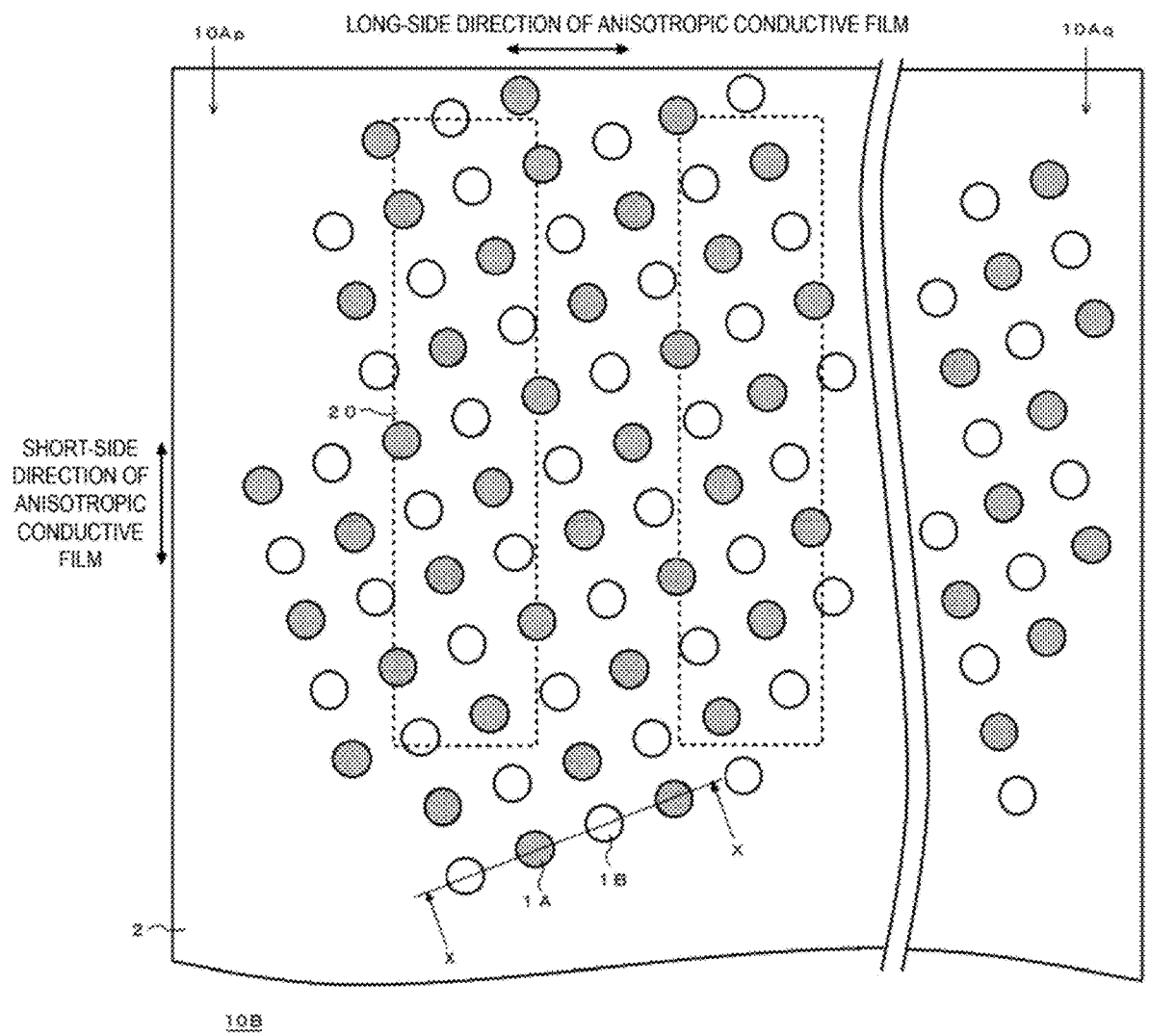
FIG. 5A is a plan view illustrating the disposition of fillers (conductive particles) in a filler-containing film (an anisotropic conductive film, which is one aspect thereof) 10B of an embodiment.
Figure 5B:
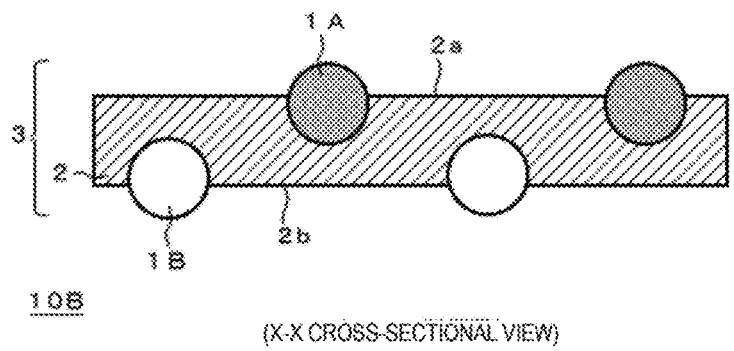
FIG. 5B is a cross-sectional view of the filler-containing film 10B of the embodiment.

The arrangement of the filler 1A in the first filler layer and the arrangement of the filler 1B in the second filler layer may be the same or different. When the arrangements thereof are the same, the filler 1A of the first filler layer and the filler 1B of the second filler layer may be configured to not overlap in a plan view of the filler-containing film as with the filler-containing film 10B illustrated in FIGS. 5A and 5B for example, and the configuration may be such that filler units, in which the filler 1A of the first filler layer and the filler 1B of the second filler layer are in contact or in close proximity, are formed. In this case, preferably, the filler units themselves are regularly arranged without contacting. Through this, the occurrence of short circuits can be suppressed.

Figure 6:
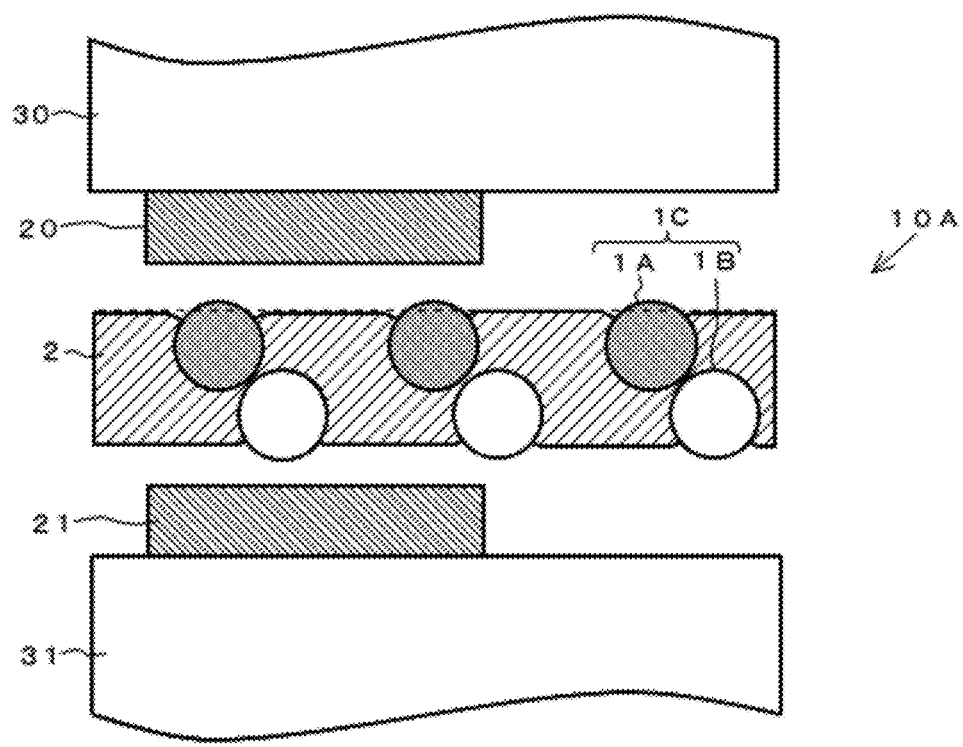
FIG. 6 is a cross-sectional view when electronic components are connected in an anisotropic conductive manner by the filler-containing film 10A.

For example, the filler units can be configured such that the arrangements themselves of the fillers 1A and 1B in the respective first filler layer and second filler layer are the same, but the arrangement of the filler 1A is shifted by a prescribed distance in the film surface direction with respect to the arrangement of the other filler 1B, and portions of the fillers 1A of the first filler layer and the fillers 1B of the second filler layer are overlapping in a plan view of the filler-containing film. In this case, when the configuration is such that filler units 1C, in which a filler 1A and a filler 1B are partially overlapped, are formed as with the anisotropic conductive film, which is one aspect of the filler-containing film 10A illustrated in FIG. 1A, because the filler-containing film is an anisotropic conductive film, an effect of any of the fillers 1A and 1B, which are conductive particles, being more easily captured at the terminals when an anisotropic conductive connection is made can be anticipated. That is, for a case in which a terminal 20 of a first electronic component 30 and a terminal 21 of a second electronic component 31 are connected in an anisotropic conductive manner using the anisotropic conductive film that is one aspect of the filler-containing film 10A illustrated in FIG. 1A, as illustrated in FIG. 6, when the filler 1A is positioned at the edges of the terminals 20 and 21, the filler 1B is present at a position overlapping the filler 1A in a plan view of the filler-containing film (anisotropic conductive film), and therefore even if the filler 1A or 1B is displaced when heating and pressurizing, the terminals 20 and 21 are connected by any of the adjacent fillers 1A and 1B, and the filler capturing performance at the terminals can be increased. Also, in this case, in a case where resin flow occurs when heating and pressurizing, the distance between the fillers 1A and 1B is increased, and therefore the possibility of the occurrence of a short circuit is also reduced. Note that on the basis of the filler diameter and number density in the overall anisotropic conductive film, which is one aspect of the filler-containing film, and on the distance between fillers, the size of terminals to be connected, and the distance between terminals, etc., partial overlapping of the fillers 1A and 1B in this manner is premised on design related short circuits not occurring even if the fillers 1A and 1B are partially overlapped, and when the fillers 1A and 1B are partially overlapped, the effect of improving capturing performance is easily satisfied while satisfying the effect of suppressing short circuits, and therefore such a configuration is preferable. These effects are further enhanced when adjacent fillers 1A and 1B are roughly flush with the respective front and rear surfaces 2a and 2b of the resin layer 2, or when adjacent fillers 1A and 1B are exposed from the respective front and rear surfaces 2a and 2b, and thus such configurations are preferable. Note that when the filler-containing film is configured as an anisotropic conductive film in this manner, even if it is assumed that the filler 1A of the first filler layer and the filler 1B of the second filler layer are fully overlapped in the film thickness direction of the above-described filler-containing film, when the film is used in an anisotropic conductive connection, melting and flowing of the resin may be generated through heating and pressurization when the anisotropic conductive connection is made, and the positions of the overlapping fillers 1A and 1B are shifted, and therefore, a problem does not exist from a practical standpoint. The same may be said with respect to aspects besides the anisotropic conductive film.

On the other hand, for a case in which the arrangement of the filler 1A in the first filler layer and the arrangement of the filler 1B in the second filler layer are different, the arrangements preferably have a common feature such as the shapes of both arrangements being similar. This is not limited to anisotropic conductive films.

Furthermore, the arrangement of the filler 1A and the arrangement of the filler 1B may each be used as a portion of a regular arrangement, and a lattice form or other regular arrangement may be formed by combining the arrangement of the filler 1A and the arrangement of the filler 1B. For example, in a case where the arrangement of the filler 1A and the arrangement of the filler 1B are combined to form a hexagonal lattice, the arrangement of the filler 1A may be a hexagon arrangement contained in a hexagonal lattice, and the arrangement of the filler 1B may be an arrangement that becomes the center of the hexagon. Note that the regular arrangement in this case is not limited to a hexagonal lattice. Furthermore, the matter of the arrangement of the filler 1A and the arrangement of the filler 1B forming any portion of a regular arrangement that is formed by combining both arrangements is also not limited. The regular arrangement that is formed by combining the arrangement of the filler 1A and the arrangement of the filler 1B may be distorted with respect to an accurate lattice arrangement, and for example, the lattice axis that is conventionally a straight line may be in a zigzag form. By adopting, in this manner, an arrangement condition for which simple reproduction is difficult, lot control is made possible, and traceability (property of enabling tracking) can also be imparted to the filler-containing film and to a connection structure that uses the same. This is also effective for matters such as forgery prevention, authenticity determination, and the prevention of unauthorized use of filler-containing films and connection structures that use the same. Moreover, ordinarily with anisotropic conductive connections, a situation occurs in which a considerable quantity of conductive particles that are linearly arranged is not captured at the edge portion of the terminal, but this type of situation can be avoided by forming the arrangement in a zigzag form. Therefore, the number of conductive particles that are captured at the terminals is more easily maintained within a constant range, and thus such a configuration is preferable. By repeating this type of distortion, the suitability of the arrangement shape can be easily determined by a sampling inspection of such.

Note that a distorted arrangement of the filler like that described above can also be formed using one transfer mold, but may also be formed with a combination of two transfer molds, a transfer mold for the filler 1A and a transfer mold for the filler 1B. By forming an arrangement of fillers (conductive particles, for example) of an overall filler-containing film such as an anisotropic conductive film using two transfer molds including a transfer mold for the filler 1A and a transfer mold for the filler 1B, various arrangements can be formed, design changes can be easily supported in a short amount of time, and a contribution to reducing manufacturing costs can be achieved. Furthermore, the total cost with regard to manufacturing anisotropic conductive films and other filler-containing films including expenses required for ownership, component management, and maintenance of manufacturing devices for manufacturing various anisotropic conductive films and other filler-containing films having different filler arrangements, can be reduced. The present invention can use a filler arrangement state design method for designing the arrangement state of fillers (conductive particles, for example) in a plan view of an overall filler-containing film such as an anisotropic conductive film using two types of transfer molds including a transfer mold for the filler 1A and a transfer mold for the filler 1B as described above, and can use a method for manufacturing an anisotropic conductive film or other filler-containing film using two types of transfer molds in accordance with the above mentioned design method.

Note that an omission in the arrangement state of the fillers 1A and 1B may be present in a range in which the intended effect of the invention of the filler-containing film is obtained. The arrangement can be confirmed with the omission being regularly present in a prescribed direction of the film. Also, an effect similar to that of the above-described distortion is obtained by adopting a configuration in which filler omissions are repeatedly present in the long-side direction of the film, or by gradually increasing or decreasing the locations of missing fillers in the long-side direction of the film. That is, lot control is made possible, and traceability (property of enabling tracking) can be imparted to the filler-containing film and to a connection structure that uses the same. This is also effective for matters such as forgery prevention, authenticity determination, and the prevention of unauthorized use of filler-containing films and connection structures that use the same.

The lattice axis or arrangement axis of the arrangements of the fillers 1A and 1B in each of the first filler layer and second filler layer may be parallel to the long-side direction of the anisotropic conductive film or other filler-containing film 10A, or may intersect the long-side direction of the anisotropic conductive film or other filler-containing film 10A. For example, when the filler-containing film is configured as an anisotropic conductive film, the lattice axis or arrangement axis can be stipulated in accordance with matters such as the terminal pitch and the width of terminals to be connected, and therefore the lattice axis or arrangement axis is not particularly limited. For example, in the case of an anisotropic conductive film for a fine pitch, as illustrated in FIG. 1A, the lattice axis A of the fillers 1A of the first filler layer is inclined with respect to the long-side direction of the anisotropic conductive film or other filler-containing film 10A, and an angle θ formed by the lattice axis A and the long-side direction (short-side direction of the film) of a terminal 20 to be connected by the anisotropic conductive film or other filler-containing film 10A is preferably from 6° to 84°, and more preferably from 11° to 74°. An effect of being able to stabilize the capturing state by inclining the lattice axis A in this manner can be anticipated even in applications other than anisotropic conductive films.

The distance between particles of the fillers 1A and 1B is established, as appropriate, according to matters such as the presence or lack of the formation of filler (conductive particles for example) units 1C, the size of the terminals that are to be connected with the anisotropic conductive film or other filler-containing film, and the terminal pitch. For example, in the case of an anisotropic conductive film, from the perspective of suppressing the occurrence of short circuits, a minimum interparticle spacing L3 of adjacent fillers 1A in the first filler layer and a minimum interparticle spacing L4 of adjacent fillers 1B in the second filler layer (see FIG. 1A) are preferably set to 1.5 times or more the respective particle diameters DA and DB of the fillers 1A and 1B when the adjacent fillers 1A and 1B, which are conductive particles, do not belong to a single filler unit (conductive particle unit), and are preferably set to 66 times or less the respective particle diameters DA and DB of the fillers 1A and 1B to ensure the minimum limit of the captured number of fillers at the terminals, and to obtain stable conduction. In particular, when the filler-containing film is configured as an anisotropic conductive film, in a case where the anisotropic conductive film is applied to fine pitch chip-on-glass (COG), the minimum interparticle spacings L3 and L4 are preferably set from 1.5 to 5 times the respective particle diameters, and in a case where the pitch is applied to relatively large pitch film-on-glass (FOG), the minimum interparticle spacings L3 and L4 are preferably set from 10 to 66 times the particles diameters. With films other than anisotropic conductive films, the minimum interparticle spacings L3 and L4 may be appropriately adjusted according to the characteristics thereof.

Note that as described below, for a case in which a filler unit 1C is formed with a plurality of fillers 1A in the first filler layer, and for a case in which a filler unit 1C is formed with a plurality of fillers 1B in the second filler layer, in the case of an anisotropic conductive film, which is one aspect of the filler-containing film, the distance between fillers 1A of the first filler layer in one filler unit 1C is preferably set to ¼ times or less of the particle diameter DA of the filler 1A, and the fillers 1A may contact each other. Likewise, the distance between fillers 1B of the second filler layer in one filler unit 1C is preferably set to ¼ times or less of the particle diameter DB of the filler 1B, and the fillers 1B may contact each other. With films other than anisotropic conductive films, the distance between the fillers may be appropriately adjusted according to the characteristics thereof.

Filler Number Density

The filler number density of the overall filler-containing film of the present invention is adjusted, as appropriate, according to matters such as the application, the required characteristics, and the particle diameters and arrangements of the fillers 1A and 1B, and therefore the filler number density is not particularly limited. The case of the below-described anisotropic conductive film can be applied. The manufacturing conditions as a filler-containing film are generally the same as the case of an anisotropic conductive film, and therefore the filler number density conditions may also be considered to be generally similar. For a case in which the filler-containing film is configured as an anisotropic conductive film, the filler number densities are adjusted, as appropriate, according to matters such as the terminal pitch with respect to the electronic components to be connected using the anisotropic conductive film, and the particle diameters and arrangements of the fillers (conductive particles) 1A and 1B in the anisotropic conductive film. For example, to suppress short circuits, the upper limit of the number density is set preferably to 70000 particles/mm$^2$ or less, more preferably 50000 particles/mm$^2$ or less, and even more preferably 35000 particles/mm$^2$ or less. On the other hand, to suppress costs by reducing the fillers (conductive particles) and to satisfy conduction performance, the lower limit of the number density is set preferably to 100 particles/mm$^2$ or greater, more preferably 150 particles/mm$^2$ or greater, and even more preferably 400 particles/mm$^2$ or greater. In particular, for a case of a fine pitch application with a minimum terminal connection area of an electronic component to be connected using the anisotropic conductive film of 2000 μm$^2$ or less, the lower limit of the number density is preferably set to 10000 particles/mm$^2$ or greater. The number density in terms of the design of the fillers 1A of the first filler layer and the number density in terms of design of the fillers 1B of the second filler layer may be equivalent or different.

In the manufacturing of the filler-containing film, in a case where the filler is to be adhered in the long-side direction of the filler-containing film, when there is a tendency for filler omissions and distribution non-uniformity to inevitably increase, preferably, one of the number density of the filler 1A of the first filler layer or the number density of the filler 1B of the second filler layer is gradually increased, and the other is gradually decreased in the long-side direction of the filler-containing film. That is, preferably the direction of increase or decrease of the number density is reversed between the first filler layer and the second filler layer. For a case in which the number density average of the fillers 1A of the first filler layer has been made equivalent in the overall anisotropic conductive film or other filler-containing film, by gradually increasing or decreasing the number densities of the fillers as described above, at one end 10Ap and another end 10Aq of the filler-containing film, the magnitude relationship of the number density of the filler 1A of the first filler layer and the number density of the filler 1B of the second filler layer is reversed, and uniformity of the number density of the overall filler-containing film is improved. For a case in which uniformity of the filler number density in the entire surface is strongly required as with an anisotropic conductive film, the level of manufacturing difficulty decreases, and therefore such an effect can be anticipated. Moreover, a cost reduction effect can be similarly anticipated with an anisotropic conductive film, and with an application besides an anisotropic conductive film.

The filler number density of the filler in the first filler layer or the second filler layer in the long-side direction of the anisotropic conductive film or other filler-containing film can be determined by setting, within an area of 20% or greater of the total film length or 3 m or greater in the long-side direction of the filler-containing film, rectangular areas with one side having 100 μm or greater as areas for measuring the filler number density at a plurality of locations (preferably 5 or more locations, more preferably 10 or more locations) at different positions in the long-side direction of the filler-containing film, setting the total surface area of the measurement area to preferably 2 mm$^2$ or greater, measuring the filler number density of each measurement area using a metallurgical microscope, and averaging the values thereof, or alternatively, by capturing an image within a range of 20% or greater of the above-described total film length or a range of 3 m or greater of the above-identified film, and then using image analysis software (for example, WinROOF from Mitani Corporation, etc.) to measure the number density of the filler. In addition, the matter of the filler number density gradually increasing or decreasing can be confirmed by the monotonic increase or decrease, in the long-side direction of the anisotropic conductive film or other filler-containing film, of the filler number density that was measured in each measurement area. Note that the area of the surface area of 100 μm×100 μm is an area in which one or more bumps is present in a connection target article with a space between bumps of 50 μm or less. In addition, the upper limit of one side of the measurement area may be adjusted, as appropriate, by the filler number density. In a case where extremely dense or sparse, for example, the filler number may be adjusted to be 200 fillers or more, and preferably 1000 fillers or more as a total number for the total surface area.

In a case where the filler-containing film is configured as an anisotropic conductive film, when the anisotropic conductive film is used in a fine pitch application with the minimum terminal connection surface area of electronic components, which are to be connected with the anisotropic conductive film, being 2000 μm$^2$ or less, a difference NpAB−NqAB between a number density NpAB of the fillers 1A and 1B of the combined first filler layer and second filler layer, at one end 10Ap of the filler-containing film (anisotropic conductive film), and a number density NqAB of the fillers 1A and 1B of the combined first filler layer and second filler layer at another end 10Aq is, with respect to an average of these (NpAB+NqAB)/2, preferably within ±2%, more preferably within ±1.5%, and even more preferably within ±1%, and in the case of a normal pitch for which the minimum terminal connection surface area exceeds 2000 μm$^2$, the difference NpAB−NqAB is, with respect to (NpAB+NqAB)/2, preferably within ±20%, and more preferably within ±10%.

For a case in which the designed filler arrangements and number densities are made equivalent in the first filler layer and the second filler layer, as the process for forming the first filler layer and the second filler layer in the resin layer 2, as described below, reversing the travel direction of the resin layer 2 between when the filler 1A that becomes the first filler layer is adhered to the resin layer 2 and when the filler 1B that becomes the second filler layer is adhered to the resin layer 2, and repeating the same process is preferable in manufacturing. For a case in which a defect is assumed to exist in the transfer mold that is used for adhering the filler, reversing the travel direction in this manner is also preferable because the position of the defect on the anisotropic conductive film or other filler-containing film does not overlap between the front and rear surfaces of the film, and the possibility of the overall film becoming inferior can be avoided.

On the other hand, for a case in which the number densities of the fillers 1A and 1B of the first filler layer and second filler layer are differed, positioning the filler layer that has the higher number density from amongst these in closer proximity to an outer interface of the anisotropic conductive film or other filler-containing film is preferable from the perspective of increasing the capturing performance of the filler at the terminal. Furthermore, in a case where a filler layer is exposed at an outer surface of the anisotropic conductive film or other filler-containing film, from the perspective of suppressing a reduction in tackiness of the anisotropic conductive film or other filler-containing film, configuring the filler layer that is exposed as a low number density layer (side with a low number density) is preferable. In this manner, the number densities of the fillers 1A and 1B of the first filler layer and the second filler layer can be appropriately differed in the filler-containing film according to the required characteristics.

Resin Layer

Viscosity of Resin Layer

The minimum melt viscosity of the resin layer 2 is not particularly limited, and can be appropriately stipulated according to matters such as the application of the filler-containing film and the method for manufacturing the filler-containing film. For example, as long as the above-described concaves 2x and 2y can be formed, the minimum melt viscosity can be set to around 1000 Pa·s depending on the method for manufacturing the filler-containing film. On the other hand, when a method of holding the filler at a prescribed disposition on the surface of the resin layer and pushing the filler into the resin layer is performed as the method for manufacturing the filler-containing film, the minimum melt viscosity of the resin is preferably set to not less than 1100 Pa·s from the perspective of ensuring that the resin layer enables film formation. The concaves 2x and 2y may be present on both sides, or may be present on only one side (namely, at either the filler 1A or the filler 1B).

In addition, as described below with regard to the method for manufacturing the filler-containing film, from the perspective of forming concaves 2x around the exposed portions of the fillers 1A and 1B pushed into the resin layer 2 as illustrated in FIG. 1B, and from the perspective of forming concaves 2y directly above the fillers 1A and 1B pushed into the resin layer 2 as illustrated in FIG. 4, the minimum melt viscosity is preferably not less than 1500 Pa·s, more preferably not less than 2000 Pa·s, even more preferably from 3000 to 15000 Pa·s, and particularly preferably from 3000 to 10000 Pa·s. This minimum melt viscosity can be determined, as one example, by using a rotary rheometer (available from TA Instruments), maintaining a constant measurement pressure of 5 g, and using a measurement plate having a diameter of 8 mm. More specifically, the minimum melt viscosity can be determined with load fluctuations of 5 g with respect to the measurement plate at a measurement frequency of 10 Hz and a rate of temperature increase of 10° C./min in a temperature range from 30 to 200° C.

Useless movement of the filler in pressure bonding of the filler-containing film to an article can be suppressed by setting the minimum melt viscosity of the resin layer 2 to a high viscosity of 1500 Pa·s or greater, and in particular, when the filler-containing film is configured as an anisotropic conductive film, the matter of causing the conductive particles that are to be held between the terminals to flow due to the flow of resin when an anisotropic conductive connection is made can be prevented.

Furthermore, for a case in which the filler dispersed-layer 3 of the filler-containing film 10A is formed by pushing the fillers 1A and 1B into the resin layer 2, when the fillers 1A and 1B are pushed in, the resin layer 2 is configured as a high viscosity viscous body so that when the fillers 1A and 1B are pushed into the resin layer 2 such that the fillers 1A and 1B are exposed from the resin layer 2, the resin layer 2 plastically deforms, and a concave 2x (FIG. 1B) is formed in the resin layer 2 around each filler 1A and 1B, or the resin layer 2 is configured as a high viscosity viscous body such that when the fillers 1A and 1B are pushed to embed into the resin layer 2 without being exposed from the resin layer 2, a concave 2y (FIG. 4) is formed in the surface of the resin layer 2 directly above each filler 1A and 1B. Therefore, the lower limit of the viscosity at 60° C. of the resin layer 2 is preferably not less than 3000 Pa·s, more preferably not less than 4000 Pa·s, and even more preferably not less than 4500 Pa·s, and the upper limit is preferably not greater than 20000 Pa·s, more preferably not greater than 15000 Pa·s, and even more preferably not greater than 10000 Pa·s. This measurement is made with the same measurement method as in the case of the minimum melt viscosity, and the viscosity can be determined by extracting the value at a temperature of 60° C.

The specific viscosity of the resin layer 2 when pushing the fillers 1A and 1B into the resin layer 2 is such that, according to the shape, the depth, and the like of the concaves 2x and 2y to be formed, the lower limit is preferably 3000 Pa·s or greater, more preferably 4000 Pa·s or greater, and even more preferably 4500 Pa·s or greater, and the upper limit is preferably 20000 Pa·s or less, more preferably 15000 Pa·s or less, and even more preferably 10000 Pa·s or less. In addition, such a viscosity is achieved at a temperature of preferably from 40 to 80° C. and more preferably from 50 to 60° C.

As described above, by forming the concaves 2x (FIG. 1B) around the fillers 1A and 1B that are exposed from the resin layer 2, the resistance that is received from the resin with respect to flattening the fillers 1A and 1B and generated when pressure bonding the filler-containing film to an article is reduced in comparison to a case in which the concaves 2x are not present. Therefore, when the filler-containing film is configured as an anisotropic conductive film, the conductive particles are more easily held by the terminals when an anisotropic conductive connection is made, and thereby conduction performance and capturing performance are both improved. With an anisotropic conductive film in particular, the fillers 1A and 1B, which are conductive particles, are present at both sides of the resin layer 2, and thus the resistance that is received from the resin is reduced. Therefore, these types of concaves 2x are preferably present at either side, and are more preferably present at both sides.

Moreover, by forming the concaves 2y (FIG. 4) in the surface of the resin layer 2 directly above the fillers 1A and 1B that are embedded without being exposed from the resin layer 2, the pressure when pressure bonding the filler-containing film to an article is more easily concentrated on the fillers 1A and 1B compared to a case in which the concaves 2y are not present. Therefore, when the filler-containing film is configured as an anisotropic conductive film, the conductive particles are more easily held by the terminals when an anisotropic conductive connection is made, and thereby both the capturing performance and the conduction performance are improved. With an anisotropic conductive film in particular, for the same reason as that described above, these types of concaves 2y are preferably present at either side, and are more preferably present at both sides. The concaves 2x and 2y may be present on one side each, or may be mixed.

"Inclines" or "Undulations" in Place of Concaves

The "concaves" 2x and 2y of the filler-containing film like those illustrated in FIG. 1B and FIG. 4 can also be described from the perspective of "inclines" or "undulations". This is described below with reference to the drawings.

The anisotropic conductive film or other filler-containing film 10A is configured from a filler dispersed-layer 3 (FIG. 1B). At the filler dispersed-layer 3, the fillers 1A and 1B are regularly dispersed in an exposed state at one surface of each of the resin layer 2. In a plan view of the film, the fillers 1A and 1B are not mutually contacting, and in the film thickness direction as well, the fillers 1A and 1B are regularly dispersed without being stacked, and a single layer of a filler layer in which the positions in the film thickness direction of the fillers 1A and 1B are made uniform is configured.

Inclines 2x with respect to a tangent plane 2p of the resin layer 2 to a central portion between adjacent fillers are formed in the surfaces 2a and 2b of the resin layer 2 around each of the fillers 1A and 1B. Note that as described below, with the filler-containing film of the present invention, an undulation 2y may also be formed in the surface of the resin layer directly above each filler 1A and 1B embedded in the resin layer 2 (FIG. 4).

With respect to the present invention, the term "incline" means a state in which the flatness of the surface of the resin layer is impaired in the vicinity of the fillers 1A and 1B, a portion of the resin layer is missing with respect to the tangent plane 2p, and the amount of resin is reduced. In other words, at an incline, the surface of the resin layer around the fillers is missing with respect to the tangent plane. On the other hand, the term "undulation" means a state in which a wave is present in the surface of the resin layer directly above the filler, a portion at which there is a difference in surface levels like that of a wave is present, and thereby the resin is reduced. In other words, the amount of resin in the resin layer directly above the filler is reduced in comparison to the amount when the surface of the resin layer directly above the filler is located in the tangent plane. These can be understood by comparing a location corresponding to directly above a filler and the flat surface portion between the fillers (FIG. 1B, FIG. 4). Note that a case also exists in which the starting point of an undulation is present as an incline.

As described above, by forming the inclines 2x (FIG. 1B) around the fillers 1A and 1B that are exposed from the resin layer 2, for a case in which the filler-containing film is configured as an anisotropic conductive film, the resistance that is received from the resin with respect to flattening of the fillers 1A and 1B that is generated when the fillers 1A and 1B are held between terminals when an anisotropic conductive connection is made is reduced in comparison to when the inclines 2x are not present, and therefore the filler is more easily held by the terminals, and thereby both conduction performance and capturing performance are improved. This incline preferably follows along the outer shape of the filler. The reason for this is that in addition to the effectiveness with respect to connection being more readily manifested, the filler is more readily recognized, and thereby inspections and such when manufacturing an anisotropic conductive film or other filler-containing film can be more readily implemented. In addition, portions of these inclines and undulations are eliminated in some cases through such as heat pressing on the resin layer, but such a case is also included in the present invention. In this case, the filler could be exposed at one point on the surface of the resin layer. Note that for a case in which the filler-containing film is configured as an anisotropic conductive film, various electronic components that are to be connected exist, and in addition to tailoring the anisotropic conductive film to these, it is desirable that the degree of freedom in design be high so that various requirements are satisfied. Therefore, even if the inclines or undulations are reduced or partially eliminated, the anisotropic conductive film can still be used.

Moreover, undulations $2y$ (FIG. 4) are formed in the surface of the resin layer 2 directly above the fillers 1A and 1B that are embedded without being exposed from the resin layer 2, and thereby, similar to a case of inclines, in a case where the filler-containing film is configured as an anisotropic conductive film, the pushing force from the terminals is easily applied to the filler when an anisotropic conductive connection is made. Furthermore, by providing undulations, the amount of resin directly above the filler is less than a case in which the resin is accumulated in a flat shape, and therefore resin directly above the filler when connecting is more easily removed, and contact between the terminals and fillers is more easily made, and therefore the filler capturing performance at the terminals is improved, and conduction reliability is enhanced.

From the perspective of more easily obtaining the above-described effects of the inclines $2x$ (FIG. 1B) of the resin layer 2 around the exposed portion of the filler and the effects of the undulations $2y$ (FIG. 4) in the resin layer directly above the filler, ratios Le/DA and Le/DB of the maximum depth Le of the inclines $2x$ around the exposed portions of the fillers 1A and 1B to the particle diameters DA and DB of the fillers 1A and 1B are preferably less than 50%, more preferably less than 30%, and even more preferably from 20 to 25%; ratios Ld/DA and Ld/DB of the maximum diameter Ld of the inclines $2x$ around the exposed portion of the fillers 1A and 1B to the particle diameters DA and DB of the fillers 1A and 1B are preferably 100% or greater, and more preferably from 100 to 150%; and ratios Lf/DA and Lf/DB of the maximum depth Lf of the undulations $2y$ in the resin directly above the fillers 1A and 1B to the particle diameters DA and DB of fillers 1A and 1B are greater than 0, and preferably less than 10%, and more preferably 5% or less.

Note that diameters Lc of the exposed portions of the fillers 1A and 1B can be set to equal to or less than the particle diameters DA and DB of the fillers 1A and 1B, and are preferably set from 10 to 90% of the particle diameters DA and DB. The fillers 1A and 1B may be exposed at one point at the apical part thereof, or the particle diameters DA and DB of the fillers 1A and 1B may be completely embedded in the resin layer 2 so that the diameter Lc is zero.

With the present invention of this type, the presence of inclines $2x$ and undulations $2y$ in the surface of the resin layer 2 can be confirmed by observing a cross section of the anisotropic conductive film or other filler-containing film using a scanning electron microscope, and can also be confirmed through surface visual observations. The inclines $2x$ and undulations $2y$ can also be observed with an optical microscope and a metallurgical microscope. In addition, the size of the inclines $2x$ and undulations $2y$ can be confirmed by, for example, adjusting the focal point when observing images. The same applies even after the inclines or undulations have been reduced through heat pressing as described above. This is because traces remain in some cases.

Layer Thickness of Resin Layer

With the anisotropic conductive film or other filler-containing film of the present invention, ratios La/DA and La/DB of a layer thickness La of the resin layer 2 to the average particle diameters DA and DB of all fillers 1A and 1B are preferably 0.3 or greater, more preferably from 0.6 to 10, even more preferably from 0.6 to 8, and particularly preferably from 0.6 to 6. Even for cases in which the respective average particle diameters of the filler 1A of the first filler layer and the filler 1B of the second filler layer are different, the averages of these may be used as the average particle diameters DA and DB. When the layer thickness La of the resin layer 2 is overly large and the ratios La/DA and La/DB exceed 10, for the case in which the filler-containing film is configured as an anisotropic conductive film, the fillers 1A and 1B, which are conductive particles, easily displace when making an anisotropic conductive connection, and the capturing performance of the fillers 1A and 1B at the terminals decreases. Conversely, when the layer thickness La of the resin layer 2 is overly small and these ratios are less than 0.3, it is difficult to maintain the fillers 1A and 1B in a prescribed arrangement in the resin layer 2.

Composition of Resin Layer

The resin layer 2 may exhibit conductivity, an insulating property, plasticity, and curability according to the application of the filler-containing film, but is preferably formed from an insulating curable resin composition, and for example, can be formed from an insulating thermo-polymerizable composition containing a thermo-polymerizable compound and a thermal polymerization initiator. As necessary, the thermo-polymerizable composition may contain a photopolymerization initiator. Known resins and compounds can be used for these. A case of an insulating resin is described below using, as an example, an anisotropic conductive film, which is one aspect of the filler-containing film.

For a case in which a thermal polymerization initiator and a photopolymerization initiator are used in combination, as the thermo-polymerizable compound, a compound which also functions as a photopolymerizable compound may be used, and a photopolymerizable compound that is separate from the thermo-polymerizable compound may be contained. Preferably, a photopolymerizable compound is contained separately from the thermo-polymerizable compound. For example, a cationic curing initiator may be used as a thermal polymerization initiator, an epoxy resin may be used as thermo-polymerizable compound, a photoradical polymerization initiator may be used as a photopolymerization initiator, and an acrylate compound may be used as a photopolymerizable compound.

As the photopolymerization initiator, a plurality of types of photopolymerization initiators that react with light of different wavelengths may be included. As a result, for a case in which the filler-containing film is configured as an anisotropic conductive film, different wavelengths may be used for the photocuring of a resin constituting the insulating resin layer when the anisotropic conductive film is manufactured, and for the photocuring of a resin for adhering electronic components to one another when an anisotropic conductive connection is made.

In photocuring when manufacturing the anisotropic conductive film as one aspect of the filler-containing film, all or part of the photopolymerizable compound contained in the resin layer can be photocured. As a result of this photocuring, the disposition of the fillers 1A and 1B in the resin layer 2 is maintained and fixed, which yields prospects for the suppression of short circuits and the enhancement of capturing performance. In addition, through this photocuring, the viscosity of the resin layer may be appropriately adjusted in the manufacturing process of the anisotropic conductive film.

The compounded amount of the photopolymerizable compound in the resin layer is preferably not greater than 30 mass %, more preferably not greater than 10 mass %, and even more preferably less than 2 mass %. This is because when the amount of the photopolymerizable compound is too large, the thrust required for pushing at the time of connection increases. Setting the compounded amount to a level described above is particularly preferable in the case of an anisotropic conductive connection because resin flow and pushing of the conductive particle held in the resin can both be achieved.

Examples of the thermo-polymerizable composition include thermal radical polymerizable acrylate-based compositions containing a (meth)acrylate compound and a thermal radical polymerization initiator, and thermal cationic polymerizable epoxy-based compositions containing an epoxy compound and a thermal cationic polymerization initiator. In place of the thermal cationic polymerizable epoxy-based composition that contains a thermal cationic polymerization initiator, a thermal anionic polymerizable epoxy-based composition that contains a thermal anionic polymerization initiator may be used. In addition, a plurality of types of thermo-polymerizable compositions may be used in combination as long as doing so does not particularly hinder the present invention. An example of combined use is the combined use of a thermal cationic polymerizable composition and a thermal radial polymerizable composition.

Herein, the (meth)acrylate compound may be an existing known thermally polymerizable (meth)acrylate monomer. Examples thereof include monofunctional (meth)acrylate-based monomers and polyfunctional, that is, bifunctional or greater, (meth)acrylate-based monomers.

Examples of the thermal radical polymerization initiator may include organic peroxides and azo-based compounds. In particular, organic peroxides that do not produce nitrogen, which can induce bubbles, can be preferably used.

The amount of the thermal radical polymerization initiator to be used is preferably from 2 to 60 parts by mass, and more preferably from 5 to 40 parts by mass, per 100 parts by mass of a (meth)acrylate compound. When the amount is too small, curing failure occur, and when the amount is too large, the product life decreases.

Examples of the epoxy compound may include bisphenol A type epoxy resins, bisphenol F type epoxy resins, novolac type epoxy resins, modified epoxy resins thereof, and alicyclic epoxy resins. Two or more of these may be used in combination. An oxetane compound may be used in addition to the epoxy compound.

The thermal cationic polymerization initiator may be a known thermal cationic polymerization initiator for epoxy compounds. Examples of the initiator include iodonium salts, sulfonium salts, phosphonium salts, and ferrocenes, which generate acid via heat. In particular, aromatic sulfonium salts, which exhibit good temperature latency, can be preferably used.

The amount of the thermal cationic polymerization initiator to be used is preferably from 2 to 60 parts by mass, and more preferably from 5 to 40 parts by mass, per 100 parts by mass of the epoxy compound. When the amount is too small, curing failure tend to occur, and when the amount is too large, the product life tends to decrease.

The thermo-polymerizable composition preferably contains a film forming resin and a silane coupling agent. Examples of the film forming resin may include, phenoxy resins, epoxy resins, unsaturated polyester resins, saturated polyester resins, urethane resins, butadiene resins, polyimide resins, polyamide resins, and polyolefin resins. Two or more of these may be used in combination. Among these, phenoxy resins may be preferably used from the perspective of film forming ability, processability, and connection reliability. The weight average molecular weight is preferably 10000 or higher. Examples of the silane coupling agent may include epoxy-based silane coupling agents and acrylic silane coupling agents. These silane coupling agents are mostly alkoxy silane derivatives.

The thermo-polymerizable composition may also contain an insulating filler separately from the above-described filler 1A and 1B to adjust the melt viscosity. Examples of this include silica powders and alumina powders. As the insulating filler, a microfiller having a particle diameter from 20 to 1000 nm is preferable, and the compounded amount is preferably from 5 to 50 parts by mass per 100 parts by mass of the epoxy compound or other thermo-polymerizable compound (photopolymerizable compound). The insulating filler that is contained separately from the fillers 1A and 1B is preferably used in cases in which the application of the filler-containing film is an anisotropic conductive film, but depending on the application, the filler does not necessarily have to be insulating, and for example, a conductive microfiller may be contained. When the filler-containing film is configured as an anisotropic conductive film, as necessary, the resin layer that forms the filler dispersed-layer can contain, as appropriate, an even more microscopic resin filler (so-called nanofiller) that differs from the fillers 1A and 1B.

Further, the filler-containing film of the present invention may also contain a filler, a softener, a promoter, an antioxidant, a colorant (pigments and dyes), an organic solvent, and an ion scavenger separately from the above-described insulating or conductive fillers.

Modified Aspects of the Filler-Containing Film Filler Unit

The filler-containing film of the present invention may be configured in various aspects with regard to the filler arrangement.

Figure 7A:
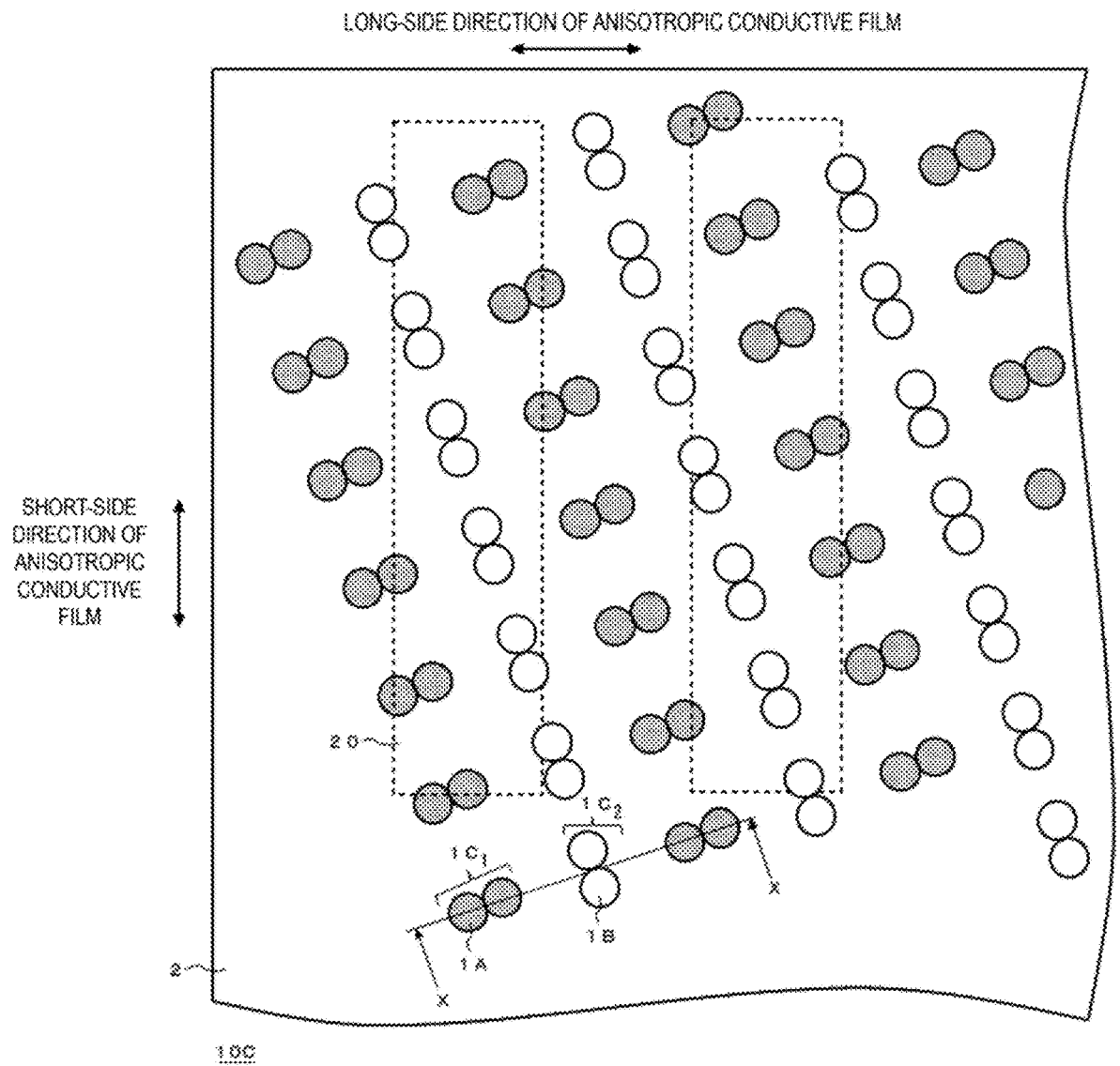
FIG. 7A is a plan view illustrating the disposition of fillers (conductive particles) in a filler-containing film (an anisotropic conductive film, which is one aspect thereof) 10C of an embodiment.
Figure 7B:
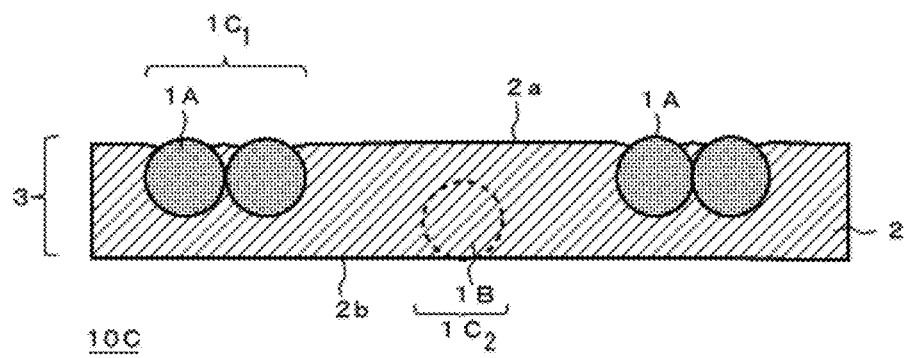
FIG. 7B is a cross-sectional view of the filler-containing film 10C of the embodiment.

For example, as with the anisotropic conductive film or other filler-containing films 10C illustrated in FIGS. 7A and 7B, an example of an aspect is one in which a filler unit $1C_1$ is formed with a plurality of fillers 1A of the first filler layer, a filler unit $1C_2$ is formed with a plurality of fillers 1B of the second filler layer, and the filler units $1C_1$ and $1C_2$ are arranged in a lattice form without the filler units $1C_1$ and $1C_2$ contacting each other, and without overlapping even in a plan view of the filler-containing film. In this case, the number of fillers 1A per one filler unit $1C_1$ of the first filler layer can be set, for example, to a quantity of from 2 to 9, and particularly from 2 to 4. The fillers 1A in the filler unit may be aligned in one row, or may be aggregated into a lump shape. Likewise, the number of fillers 1B per one filler unit $1C_2$ of the second filler layer can be set, for example, to a quantity of from 2 to 9, and particularly from 2 to 4. The fillers 1B in the filler unit may be aligned in one row, or may be aggregated into a lump shape. In the case of an anisotropic conductive film, this can also be applied according to the terminal layout by disposing the filler units so that the risk of a short circuit is reduced. In applications besides anisotropic conductive films, adjustments can be appropriately made according to the objective.

In the case of an anisotropic conductive film, from the perspective of improving the filler (conductive particle) capturing performance, and suppressing short circuits, preferably, the filler units $1C_1$ of the first filler layer and the filler units $1C_2$ of the second filler layer are respectively configured with fillers aligned in a single row, and the long-side directions of these are preferably non-parallel, and particularly, are preferably orthogonal as illustrated in FIG. 7A and FIG. 7B.

Figure 8A:
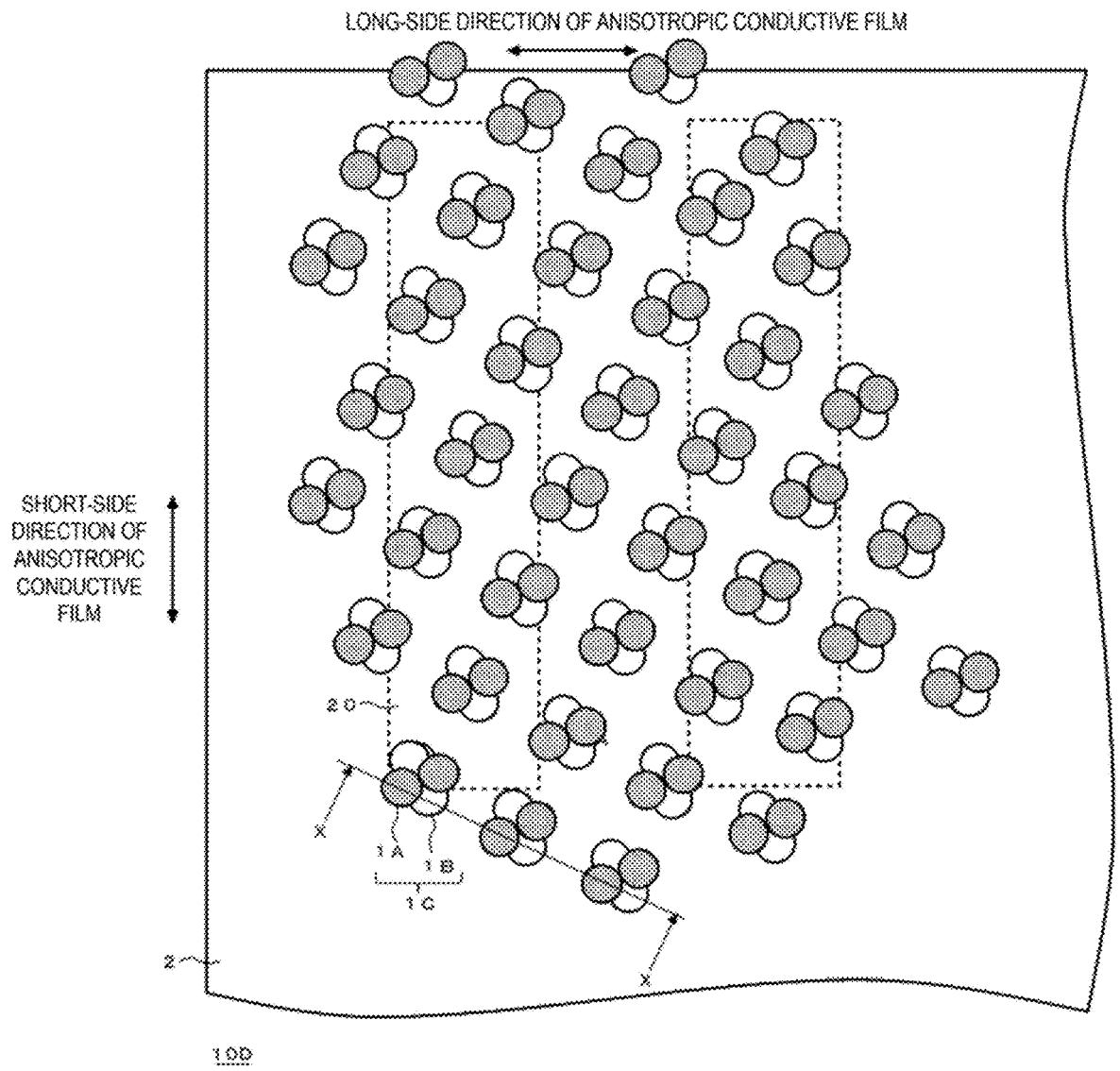
FIG. 8A is a plan view illustrating the disposition of fillers (conductive particles) in a filler-containing film (an anisotropic conductive film, which is one aspect thereof) 10D of an embodiment.
Figure 8B:
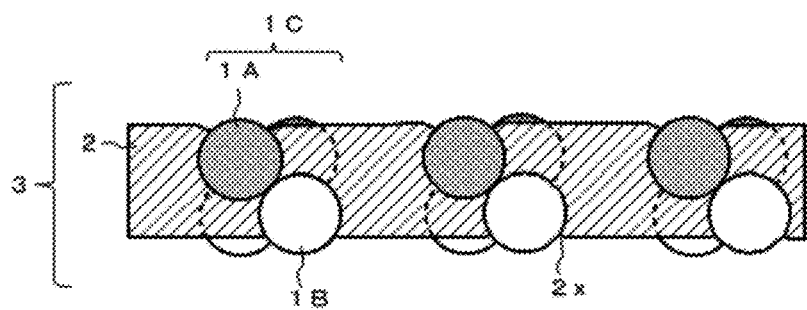
FIG. 8B is a cross-sectional view of the filler-containing film 10D of the embodiment.

Furthermore, as with the anisotropic conductive film or other filler-containing film 10D illustrated in FIG. 8A and FIG. 8B, filler units 1C may be formed by causing a plurality of fillers 1A of the first filler layer which are mutually contacting or in close proximity, and a plurality of fillers 1B of the second filler layer which are mutually contacting or in close proximity, to contact or be in close proximity. These filler units 1C are preferably regularly arranged without the filler units 1C contacting each other. Moreover, preferably, the number of fillers 1A of the first filler layer per one filler unit 1C is set from 2 to 9, and more particularly from 2 to 4, and the number of fillers 1B of the second filler layer per one filler unit 1C is set from 2 to 9, and particularly from 2 to 4. Similar to the description above, in the case of an anisotropic conductive film, this can also be applied according to the terminal layout by disposing the filler units so that the risk of a short circuit is reduced. In applications besides anisotropic conductive films, adjustments can be appropriately made according to the objective.

Figure 9:
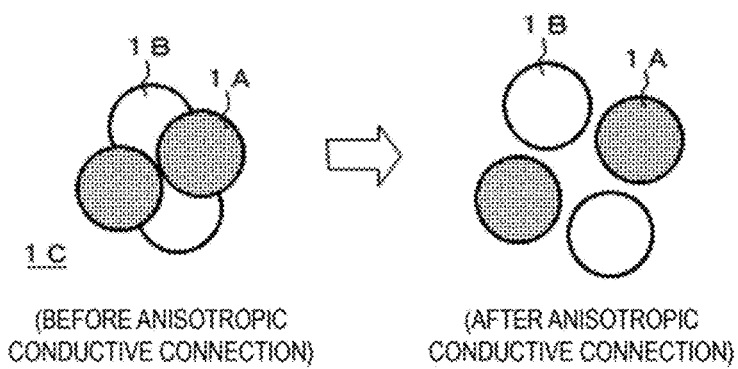
FIG. 9 is a plan view illustrating the disposition of a filler unit 1C before and after the anisotropic conductive connection.
Figure 10:
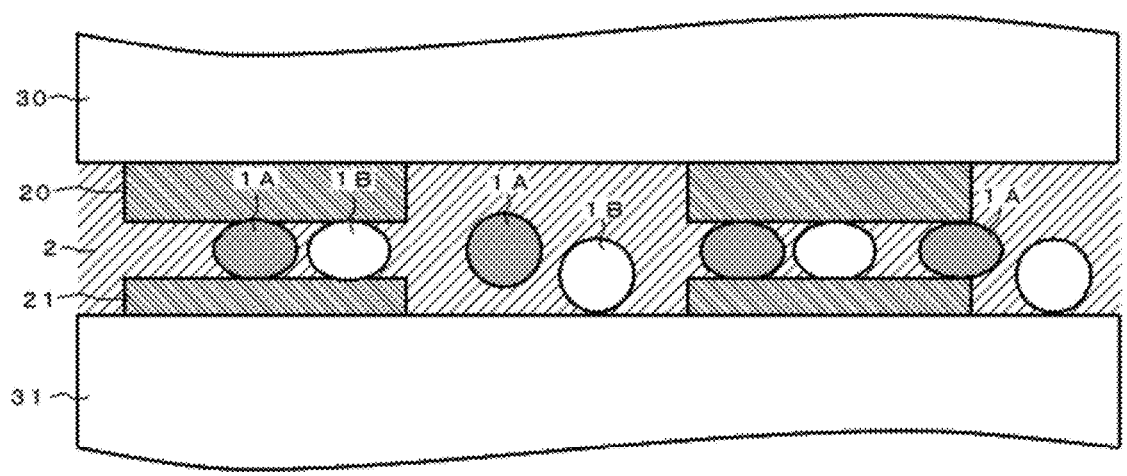
FIG. 10 is a cross-sectional view of a connection structure for which electronic components are connected in an anisotropic conductive manner using the filler-containing film 10D.

In the case of an anisotropic conductive film, when the filler-containing film 10D including filler units 1C formed with a plurality of fillers (conductive particles) 1A and 1B in this manner is used in an anisotropic conductive connection, and is pushed in the film thickness direction, as illustrated in FIG. 9, the fillers (conductive particles) 1A and 1B that were mutually contacting are radially spread out, and the fillers (conductive particles) 1A and 1B can be separated. In this case, as illustrated in FIG. 10, even in the area between terminals where the fillers (conductive particles) 1A and 1B are not pressed by the opposing terminals 20, 21, the fillers 1A and 1B that formed the filler unit 1C before the anisotropic conductive connection separate. Therefore, according to this filler-containing film 10D, short circuits between adjacent terminals can be suppressed. Even for a case in which the fillers (conductive particles) 1A and 1B are positioned at an edge portion of the opposing terminals 20, 21 before an anisotropic conductive connection, at least one of the fillers 1A and 1B is captured by the terminals 20, 21 through the anisotropic conductive connection. Therefore, according to the filler-containing film 10D, the conductive particle capturing efficiency is improved. In applications besides the anisotropic conductive film as well, this type of filler unit 1C may be formed, according to the objective. It is considered that application is preferable for cases of pressing with a pressure-bonding roller. This is because a pressurizing load is easily applied also in a direction besides the film thickness direction.

Aspect in which Omission of Disposition of Fillers in One Filler Layer is Supplemented by Another Filler Layer One of either the first filler layer or the second filler layer may be formed with an arrangement and number density prescribed according to the design, after which the filler arrangement and number density for the entire area are confirmed, and the other filler layer is formed to match the particle disposition of the one conductive particle layer, and also as necessary, to supplement an omission in the particle disposition of the one filler layer, and omissions can be eliminated by configuring the fillers in the prescribed disposition as an overall anisotropic conductive film or other filler-containing film. Accordingly, with the filler layer that is formed later, the number density may be changed in the long-side direction of the filler-containing film. By configuring in this manner, the yield of the filler-containing film is improved, and a cost reduction effect can be anticipated.

Lamination of Second Resin Layer

Figure 11A:
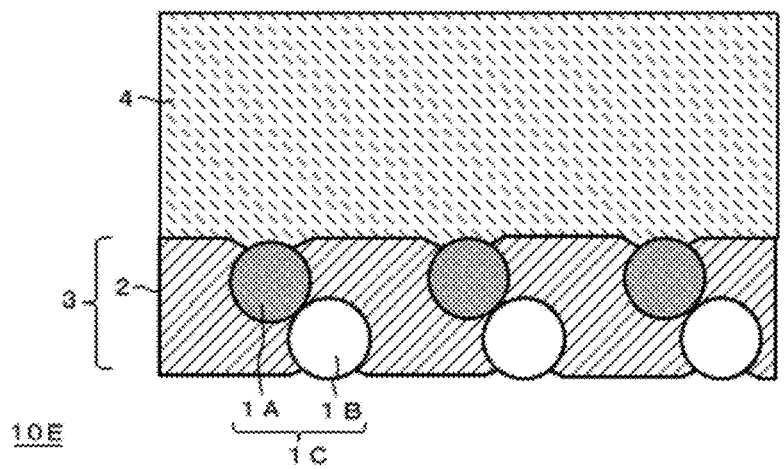
FIG. 11A is a cross-sectional view of a filler-containing film (an anisotropic conductive film, which is one aspect thereof) 10E including a second resin layer.
Figure 11B:
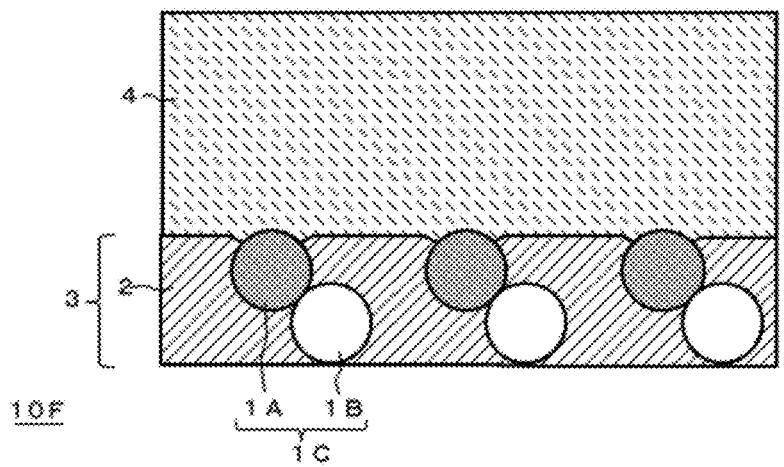
FIG. 11B is a cross-sectional view of a filler-containing film (an anisotropic conductive film, which is one aspect thereof) 10F including a second resin layer.
Figure 11C:
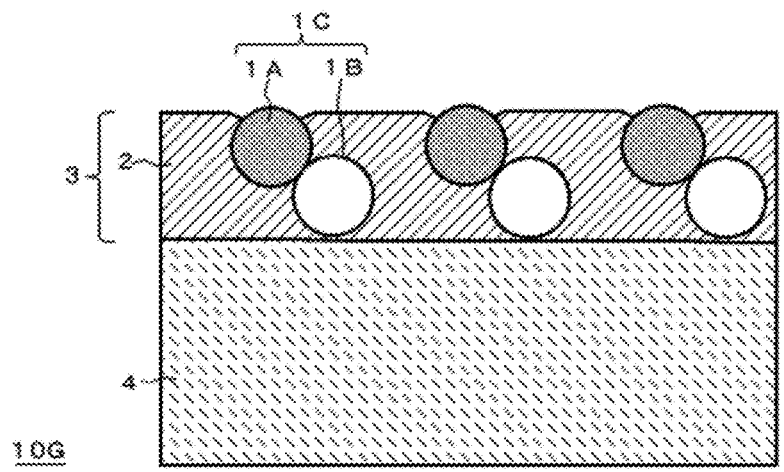
FIG. 11C is a cross-sectional view of a filler-containing film (an anisotropic conductive film, which is one aspect thereof) 10G including a second resin layer.

As with the anisotropic conductive film or other filler-containing film 10E illustrated in FIG. 11A, a second resin layer 4 preferably having a minimum melt viscosity that is lower than that of the resin layer 2 forming the filler dispersed-layer 3 may be laminated on one surface of the filler dispersed-layer 3. Moreover, in a case where the embedding percentages in the resin layer 2 of the first filler layer and the second filler layer differ, and the first filler layer is exposed from the resin layer more so than the second filler layer, as with the anisotropic conductive film or other filler-containing film 10F illustrated in FIG. 11B, the second resin layer 4 may be laminated on the first filler layer side that has a large amount of protrusion from the resin layer 2, or as with the anisotropic conductive film or other filler-containing film 10G illustrated in FIG. 11C, the second resin layer 4 may be laminated on the surface of the resin layer 2 at which the filler layer does not protrude. As a result of the lamination of the second resin layer 4, the spaces formed by the electrodes or bumps of the electronic components can be filled when the electronic components are connected in an anisotropic conductive manner using the anisotropic conductive film or other filler-containing film, and thereby the adhesiveness can be improved. Note that when the second resin layer 4 is laminated, preferably the second resin layer 4 is configured to bond to the electronic component that is to be pressurized with a tool (resin layer 2 is configured to bond to an electronic component that is placed on a stage). As a result, the unintended movement of the filler can be avoided, and the capturing performance can be enhanced.

A greater difference between the minimum melt viscosities of the resin layer 2 and the second resin layer 4 facilitates the filling of the space formed by the electrodes or bumps of the electronic component with the second resin layer 4, and thereby, an effect of enhancing the adhesiveness between electronic components can be anticipated. In addition, when this difference is greater, the amount of movement of the resin layer 2 present in the filler dispersed-layer 3 becomes relatively small, and thereby the filler capturing performance of the terminals is more easily enhanced. From a practical standpoint, the minimum melt viscosity ratio between the resin layer 2 and the second resin layer 4 is preferably not less than 2, more preferably not less than 5, and even more preferably not less than 8. On the other hand, when this ratio is too large, a protrusion or blocking of the resin may occur when a long anisotropic conductive film or other filler-containing film is formed into a wound body, and therefore the ratio thereof is preferably not greater than 15 from a practical standpoint. More specifically, the preferable minimum melt viscosity of the second resin layer 4 satisfies the ratio described above and is not greater than 3000 Pa·s, more preferably not greater than 2000 Pa·s, and particularly preferably from 100 to 2000 Pa·s.

Note that the second resin layer 4 can be formed by adjusting the viscosity of a resin composition that is similar to that of the resin layer.

The layer thickness of the second resin layer 4 is preferably from 4 to 20 μm. Alternatively, the layer thickness thereof is from 1 to 8 times the filler diameter.

Furthermore, the minimum melt viscosity of the overall anisotropic conductive films or other filler-containing films 10E, 10F, 10G that include the resin layer 2 and the second resin layer 4 is, from a practical standpoint, 8000 Pa·s or less, preferably from 200 to 7000 Pa·s, and particularly preferably from 200 to 4000 Pa·s.

Lamination of Third Resin Layer

A third resin layer may be provided on the resin layer 2 so that the resin layer 2 is sandwiched between the third resin layer and the second resin layer 4. The third resin layer may be made to function as a tack layer.

The resin composition, viscosity, and thickness of the third resin layer may be the same as or different than those of the second resin layer. The minimum melt viscosity of the anisotropic conductive film or other filler-containing films combining the resin layer 2, the second resin layer 4, and the third resin layer is not particularly limited, but from a practical standpoint, is not greater than 8000 Pa·s, preferably from 200 to 7000 Pa·s, and particularly preferably from 200 to 4000 Pa·s.

Other Lamination Aspects

Depending on the application of the filler-containing film, a plurality of filler dispersed-layers 3 may be laminated, a layer not containing a filler like the second resin layer may be interposed between laminated filler dispersed-layers, and the second resin layer and the third resin layer may be provided on the outermost layer.

Method for Manufacturing Filler-Containing Film

The filler-containing film of the present invention including a single layer of the filler dispersed-layer 3 as the resin layer can be obtained, for example, by retaining the filler 1A in a predetermined dispersion on one surface of the resin layer 2 (preferably, retaining in a predetermined arrangement), pushing the filler 1A thereof into the resin layer 2 using a flat plate or roller, etc., and likewise retaining the filler 1B in a predetermined dispersion on the other surface of the resin layer 2 (preferably, retaining in a predetermined arrangement), and pushing the filler 1B therein. When the fillers are retained in a predetermined dispersed state on both surfaces of the resin layer, the fillers can be adhered with various techniques such as using a coating roll and using a transfer mold, but preferably, the direction in which the filler is retained on one surface of the resin layer, and the direction in which the filler is retained on the other surface are reversed (180 degrees). Through this, non-uniformity of the dispersed state of the filler on the front surface of the film, and non-uniformity of the dispersed state of the filler on rear surface can be mitigated when viewed with the front and rear sides integrated.

Figure 12A:
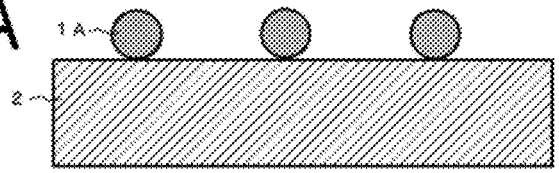
FIG. 12A to 12E are images for explaining the steps of a method for manufacturing a filler-containing film (an anisotropic conductive film, which is one aspect thereof) 10 including a second resin layer.
Figure 12B:
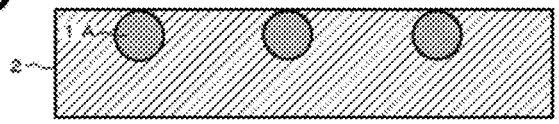
Figure 12C:
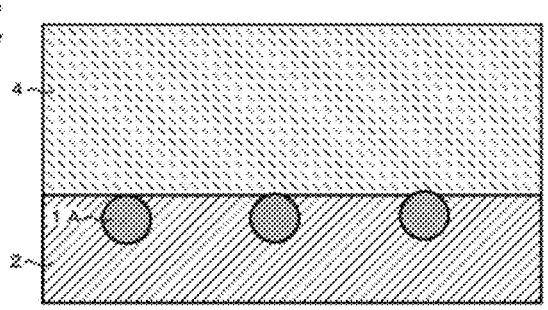
Figure 12D:
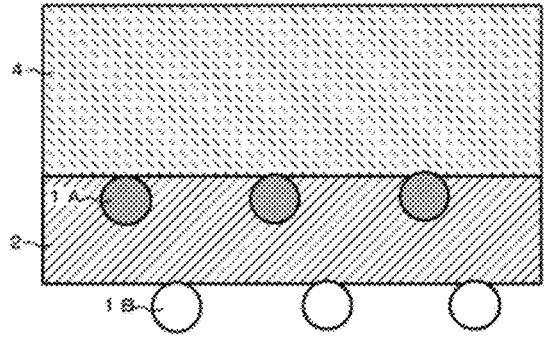
Figure 12E:
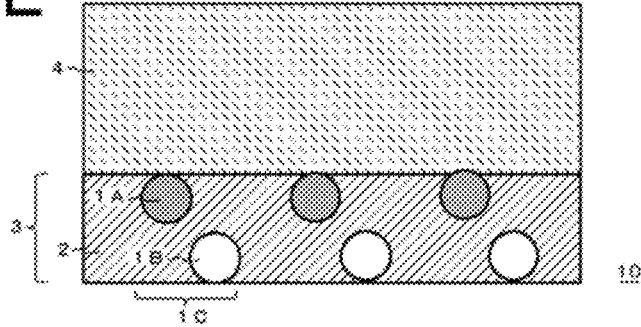

Furthermore, an anisotropic conductive film or other filler-containing film including a second resin layer 4 laminated to the filler dispersed-layer 3 can be obtained, for example, in the manner illustrated in FIGS. 12A to 12E. Specifically, the filler 1A is adhered to one surface of the resin layer 2 (FIG. 12A), and pushed into the resin layer 2 (FIG. 12B), and subsequently, the second resin layer 4 is laminated onto the surface into which the filler 1A was pushed (FIG. 12C). The filler 1B is adhered to the other surface of the resin layer 2 on the side opposite the second resin layer 4 (FIG. 12D), and then the filler 1B is pushed into the resin layer 2 (FIG. 12E). In this manner, an anisotropic conductive film or other filler-containing film 10 including the second resin layer 4 laminated onto the filler dispersed-layer 3 can be obtained. In this case, filler units 1C in which, in a plan view, these fillers 1A and 1B are in contact or in close proximity, are formed by appropriately establishing the disposition of the filler 1A that is pressed from one surface of the resin layer 2, and the disposition of the filler 1B that is pressed from the other surface.

With regard to an anisotropic conductive film or other filler-containing film for which the resin layer is formed of a single layer of the filler dispersed-layer 3, with regard to an anisotropic conductive film or other filler-containing film for which the second resin layer 4 is laminated to the filler dispersed-layer 3, and also with regard to an aspect in which a third resin layer is further laminated, examples of the technique for adhering the fillers 1A and 1B to the resin layer 2 or of the method for forming the resin layer 2 in which the fillers 1A and 1B are dispersed include a method of using a transfer mold to transfer the fillers to the resin layer, a method of dispersing the fillers on the resin layer, and a method which, similar to the method described in Patent Document 1, uses a coating roll including regular grooves in the surface of a gravure coater or such to apply a resin solution that contains a filler onto a resin layer or release film. Note that with the method of using a coating roll to apply a resin solution containing a filler onto a release film, the resin layer that is formed thereby can be used as the resin layer 2. With the method described by Patent Document 1, as described previously, it is surmised that in comparison to the method that uses a transfer mold, the filler cannot be regularly arranged with as much precision. However, in the present invention, in a case where the adherence directions of the filler 1A that forms the first filler layer and the filler 1B that forms the second filler layer are reversed, the adherence directions being in the long-side direction of the anisotropic conductive film, when forming the conductive particle layers, even for a case in which filler omissions or locations of non-uniformity in the number density are formed, there is roughly no overlap of filler omissions and portions of non-uniform number densities with both the first filler layer and the second filler layer, and therefore the impact on the conduction property from any filler omissions and non-uniformity of the number density in the individual filler layers can be reduced.

Of the above-described methods, use of the transfer mold is preferable from the perspective of improving the precision of the filler arrangement. An example of a transfer mold that can be used is a mold made of an inorganic material or an organic material and including openings formed by a known opening forming process, such as photolithography. Examples of the inorganic material include silicon, various ceramics, glass, and metal such as stainless steel. Examples of the organic material include various resins. The transfer mold may have a plate shape, a roll shape, or another shape.

Generally, in a step of using a transfer mold to adhere conductive particles or other such filler to a resin layer, the conductive particles are sequentially adhered in a direction from one end of the resin layer to other end to manufacture a long anisotropic conductive film or other filler-containing film. However, as the filler adherence step is continued, there is a tendency for the filler to not be adhered to the resin layer due to clogging of the mold, resulting in an increase in locations of filler omissions in the anisotropic conductive film or other filler-containing film. Therefore, when the filler that forms the first filler layer is adhered from one end of the resin layer to the other end, the filler that forms the second filler layer is preferably adhered in a direction from the other end of the resin layer to the one end. By reversing the adherence direction in this manner, the area with a high probability of conductive particle omissions being present in the first filler layer becomes an area with a low probability of filler omissions being present in the second filler layer, the filler number density of the overall anisotropic conductive film or other filler-containing film can be made uniform, and excessive omissions that impact filler performance (connection failure in the case of an anisotropic conductive film) in an anisotropic conductive connection can be eliminated. Moreover, a long anisotropic conductive film or other filler-containing film is ordinarily manufactured as a wound body, and therefore when manufacturing with the adherence directions of the first filler layer and the second filler layer being reversed, preferably, first, the resin layer is formed into a wound body while adhering the filler that becomes the first filler layer from one end to the other end of the long resin layer, next, while unwinding the wound body, the filler that becomes the second filler layer is adhered to the resin layer in a direction that is reversed from the adherence direction of the first filler layer, and the resin layer is then formed into a wound body. Through this, compared to a step in which the wound body of the resin layer on which the first filler layer was formed is unwound, and once again, filler that forms the second filler layer is adhered to the resin layer in the same adherence direction as that of the first filler layer, the above-described step can be more simplified, and therefore a cost reduction effect can be anticipated. Note that when the adherence direction is reversed, as necessary, a clogged transfer mold may be replaced with a new transfer mold, or may be cleaned. In the case of a product for which filler omissions can be tolerated to a certain extent, the frequency of replacement and cleaning of the transfer mold can be reduced, and therefore a cost reduction effect can also be anticipated from this perspective.

Even with the method of using a coating roll to applying a resin solution containing conductive particles onto a resin layer or a release film, as the application of the resin solution is continued, grooves in the coating roll surface become clogged, and therefore preferably, the filler is applied from the other end of the film to the one end.

In addition, even with the method of dispersing the filler on the filler layer, in some cases, filler omissions are cyclically repeated. In this type of case as well, the travel direction of the resin layer is preferably reversed between when the filler that becomes the first filler layer is adhered to the resin layer and when the filler that becomes the second filler layer is adhered to the resin layer so that locations of the occurrence of filler omissions do not overlap on the front and rear of the resin layer.

When manufacturing with any of the above-described manufacturing methods, in a case where a long anisotropic conductive film or other filler-containing film is to be manufactured, the inevitable formation of locations that become filler omissions is anticipated. However, by reversing the adherence direction of the fillers of the first filler layer and the second filler layer in the long-side direction of the anisotropic conductive film or other filler-containing film, the locations of omissions on the anisotropic conductive film or other filler-containing film can be dispersed without being concentrated in one location. Accordingly, the present invention can contribute to improving the yield of the anisotropic conductive film or other filler-containing film, and to reducing manufacturing costs.

Note that with respect to an anisotropic conductive film or other filler-containing film, reversing the adherence direction of the first filler layer and the adherence direction of the second filler layer is effective for reducing variations in the filler number density of the anisotropic conductive film or other filler-containing film, both for a case in which the filler arrangement pattern and number density in the first filler layer, and the filler arrangement pattern and number density in the second filler layer are the same, and a case in which they are different. For example, in the design of an anisotropic conductive film or other filler-containing film, for a case in which the filler arrangements are made equivalent in the first filler layer and the second filler layer, and the respective number densities are set, for example, to 400 particles/mm$^2$, according to the above-described manufacturing method, the absolute value of the difference in number densities between one end and the other end in the long-side direction of the anisotropic conductive film or other filler-containing film that is actually manufactured is preferably 160 particles/mm$^2$ or less, and more preferably 80 particles/mm$^2$ or less, and likewise, when the number densities of the conductive particles of the first filler layer and the second filler layer are respectively set to 65000 particles/mm$^2$, the absolute value of the difference in the number densities between the one end and the other end in the long-side direction of the anisotropic conductive film is preferably 26000 particles/mm$^2$ or less, and more preferably 13000 particles/mm$^2$ or less. That is, the absolute value of the difference between the number densities of the one end and the other end in the long-side direction of the anisotropic conductive film or other filler-containing film is preferably within a range of ±20% and more preferably ±10% of 800 to 130000 particles/mm$^2$, which is the average of the number density of conductive particles including both the first filler layer and the second filler layer. Note that the present invention does not exclude a case in which the number density is less than 400 particles/mm$^2$. In addition, an example of an anisotropic conductive film was described, but the present invention is not limited thereto. For example, with an optical film as well, it can be easily surmised that the performance thereof can be stabilized by making the number density uniform. The same can be said for films that are directly connected to external appearance such as matte films.

The embedded amount of the fillers 1A and 1B adhered to the resin layer 2 can be adjusted by the pushing force and temperature, etc. when pushing of the fillers 1A and 1B. In addition, the shape, depth, and presence or lack of concaves 2x and 2y can be adjusted by the viscosity of the resin layer 2, the pushing speed, and temperature, etc. when pushing in the fillers 1A and 1B. An example of a pushing method for achieving an embedding percentage of greater than 100% is a method of pushing with a pushing plate including convex portions corresponding to the filler arrangement.

The anisotropic conductive film or other filler-containing film that was formed in a long shape is appropriately cut and formed into an anisotropic conductive film or other filler-containing film product as a wound body. Accordingly, the anisotropic conductive film or other filler-containing film of the present invention has a length from 5 to 5000 m, and can be formed into a wound body.

To economically connect an electronic component using an anisotropic conductive film that is included in the filler-containing films, the anisotropic conductive film is preferably long with a length of a certain extent. Thus, the anisotropic conductive film is manufactured with a length of preferably 5 m or greater, more preferably 10 m or greater, and even more preferably 25 m or greater. However, when the anisotropic conductive film is excessively long, a connecting device previously used in case of manufacturing an electronic device using the anisotropic conductive film cannot be used, and handling ease also become inferior. Therefore, the anisotropic conductive film is manufactured with a length of preferably 5000 m or less, more preferably 1000 m or less, and even more preferably 500 m or less. This type of long body of the anisotropic conductive film excels in handling ease when formed into a wound body that is wound onto a winding core, and thus such a configuration is preferable.

Method for Using Filler-Containing Film

The filler-containing film of the present invention can be used in the same manner as conventional filler-containing films, and an article is not particularly limited as long as the filler-containing film can be bonded thereto. The filler-containing film can be adhered, according to the application, to various articles through pressure bonding, and preferably through thermocompression bonding. When bonding, photoirradiation may be used, or a combination of heat and light may be used. For example, in a case where the resin layer of the filler-containing film has sufficient adhesiveness with respect to an article to which the filler-containing film is to be bonded, a film adhered body for which the filler-containing film has been adhered to the surface of one article can be obtained by lightly pressing the resin layer of the filler-containing film against the article. In this case, the surface of the article is not limited to being flat, and may contain surface irregularities, and may be curved overall. In a case where the article is a film shape or a flat plate shape, a pressure-bonding roller may be used to bond the filler-containing film to these articles. Through this, the filler of the filler-containing film and the article can also be directly bonded.

Furthermore, the filler-containing film can be interposed between two opposing articles, and the two articles can be bonded using a thermocompression bonding roller or pressure bonding tool such that the filler is held between the articles thereof. In addition, the filler-containing film can be sandwiched by articles such that the filler and the articles are not directly contacting.

In particular, when the filler-containing film is configured as an anisotropic conductive film, the anisotropic conductive film can be advantageously used when a thermocompression bonding tool is used to connect in an anisotropic conductive manner through the anisotropic conductive film, a first electronic component such as an IC chip, an IC module, or an FPC to a second electronic component such as an FPC, a glass substrate, a plastic substrate, a rigid substrate, or a ceramic substrate. The anisotropic conductive film may also be used to stack an IC chip and wafer to create multiple layers. Note that the electronic components that can be connected using the anisotropic conductive film of the present invention are not limited to the above mentioned electronic components. The film can be used with various electronic components, which have become more diversified in recent years.

Accordingly, the present invention includes a connection structure obtained by adhering the filler-containing film of the present invention to various articles through pressure bonding, and to a method for manufacturing the same. In particular, for a case in which the filler-containing film is used as an anisotropic conductive film, the present invention also includes a method for manufacturing a connection structure by using the anisotropic conductive film and connecting electronic components each other in an anisotropic conductive manner, and a connection structure obtained thereby, namely, a connection structure for which electronic components are connected each other in an anisotropic conductive manner through the anisotropic conductive film of the present invention.

An example of a method for connecting electronic components to each other using the anisotropic conductive film may be as follows. For a case in which the anisotropic conductive film is made from a single conductive particle dispersed-layer, the anisotropic conductive film is temporarily bonded and temporarily pressure bonded to a second electronic component such as various substrates from the side of the anisotropic conductive film at which the conductive particles are embedded into the surface, a first electronic component such as an IC chip is aligned with the side of the temporarily pressure bonded anisotropic conductive film at which the conductive particles are not embedded into the surface, and this is subjected to thermocompression bonding, and thereby manufacturing can be performed. For a case in which the insulating resin layer of the anisotropic conductive film contains not only a thermal polymerization initiator and a thermo-polymerizable compound, but also a photopolymerization initiator and a photopolymerizable compound (may be the same as the thermo-polymerizable compound), a pressure bonding method that uses both light and heat may be used. When this is done, unintentional movement of the conductive particles can be minimized. In addition, the side into which the conductive particles are not embedded may be temporarily bonded to the second electronic component and used. Note that the anisotropic conductive film can also be temporarily bonded to the first electronic component rather than the second electronic component.

Furthermore, for a case in which the anisotropic conductive film is formed from a layered body of a conductive particle dispersed-layer and a second insulating resin layer, the conductive particle dispersed-layer is temporarily bonded and temporarily pressure bonded to a second electronic component such as various substrates, and an IC chip or other first electronic component is aligned with and placed on the second insulating resin layer side of the temporarily pressure bonding anisotropic conductive film, and then the unit is thermocompression bonded. The second insulating resin layer side of the anisotropic conductive film may also be temporarily bonded to the first electronic component. Furthermore, the conductive particle dispersed-layer side can be temporarily bonded to the first electronic component and used.

EXAMPLES

An anisotropic conductive film, which is one aspect of the filler-containing film of the present invention, will be described in detail below through examples.

(1) Manufacturing of Anisotropic Conductive Film (1-1) Examples 1A and 1B to Example 8

With the composition shown in Table 1, resin compositions were prepared for forming (i) a high viscosity first insulating resin layer (hereinafter, also referred to as the layer A) for forming a conductive particle dispersed-layer, (ii) a second insulating resin layer (hereinafter, also referred to as the layer N) having a lower viscosity than the first insulating resin layer, and (iii) a third insulating resin layer that forms a tack layer.

The resin composition forming the first insulating resin layer (layer A) was coated onto a PET film with a film thickness of 50 µm using a bar coater, and this was dried for 5 minutes in an oven at 80° C. to form an insulating resin layer with the thickness shown in Table 2 on the PET film. Similarly, the second insulating resin layer (layer N) and the third insulating resin layer (tack layer) were formed on the PET film at the respective thicknesses shown in Table 3.

TABLE 1

| | Composition | Example 1A | Example 1B | Example 2 | Example 3 | Example 4 | Example 5 |
|---|---|---|---|---|---|---|---|
| Second insulating resin layer (layer N) | Phenoxy resin (YP-50, Nippon Steel & Sumikin Chemical Co., Ltd.) | 30 | ← | 40 | ← | ← | ← |
| | Silica filler (Aerosil R805, Nippon Aerosil Co., Ltd.) | — | — | 5 | ← | 10 | 5 |
| | Epoxy resin (jER4007P, Mitsubishi Chemical Corp.) | 30 | ← | — | — | — | — |
| | Liquid epoxy resin (jER828, Mitsubishi Chemical Corp.) | — | — | 50 | ← | 45 | 50 |
| | Silane coupling agent (KBM-403, Shin-Etsu Chemical Co., Ltd.) | — | — | 2 | ← | ← | ← |
| | Encapsulated imidazole-based curing agent (Novacure HX3941HP, Asahi Kasei Corporation) | 40 | ← | — | — | — | — |
| | Thermal cationic polymerization initiator (SI-60L, Sanshin Chemical Industry Co., Ltd.) | — | — | 3 | ← | ← | ← |
| First insulating resin layer (layer A) | Phenoxy resin (YP-50, Nippon Steel & Sumikin Chemical Co., Ltd.) | 48 | ← | 40 | ← | ← | ← |
| | Silica filler (Aerosil R805, Nippon Aerosil Co., Ltd.) | 12 | ← | 25 | 15 | 25 | ← |
| | Liquid epoxy resin (jER828, Mitsubishi Chemical Corp.) | — | — | 30 | 40 | 30 | ← |
| | Silane coupling agent (KBM-403, Shin-Etsu Chemical Co., Ltd.) | — | — | 2 | ← | ← | ← |
| | Encapsulated imidazole-based curing agent (Novacure HX3941HP, Asahi Kasei Corporation) | 40 | ← | — | — | — | — |
| | Thermal cationic polymerization initiator (SI-60L, Sanshin Chemical Industry Co., Ltd.) | — | — | 3 | ← | ← | ← |
| Third insulating resin layer (tack layer) | Phenoxy resin (YP-50, Nippon Steel & Sumikin Chemical Co., Ltd.) | — | — | — | — | — | 40 |
| | Silica filler (Aerosil R805, Nippon Aerosil Co., Ltd.) | — | — | — | — | — | 3 |
| | Liquid epoxy resin (jER828, Mitsubishi Chemical Corp.) | — | — | — | — | — | 52 |
| | Silane coupling agent (KBM-403, Shin-Etsu Chemical Co., Ltd.) | — | — | — | — | — | 2 |
| | Thermal cationic polymerization initiator (SI-60L, Sanshin Chemical Industry Co., Ltd.) | — | — | — | — | — | 3 |

| | Composition | Example 6 | Example 7 | Example 8 | Comparative Example 1 | Comparative Example 2 | Comparative Example 3 |
|---|---|---|---|---|---|---|---|
| Second insulating resin layer (layer N) | Phenoxy resin (YP-50, Nippon Steel & Sumikin Chemical Co., Ltd.) | ← | ← | ← | ← | ← | ← |
| | Silica filler (Aerosil R805, Nippon Aerosil Co., Ltd.) | ← | ← | ← | ← | ← | ← |
| | Epoxy resin (jER4007P, Mitsubishi Chemical Corp.) | — | — | — | — | — | — |
| | Liquid epoxy resin (jER828, Mitsubishi Chemical Corp.) | ← | ← | ← | ← | ← | ← |
| | Silane coupling agent (KBM-403, Shin-Etsu Chemical Co., Ltd.) | ← | ← | ← | ← | ← | ← |
| | Encapsulated imidazole-based curing agent (Novacure HX3941HP, Asahi Kasei Corporation) | — | — | — | — | — | — |
| | Thermal cationic polymerization initiator (SI-60L, Sanshin Chemical Industry Co., Ltd.) | ← | ← | ← | ← | ← | ← |
| First insulating resin layer (layer A) | Phenoxy resin (YP-50, Nippon Steel & Sumikin Chemical Co., Ltd.) | ← | ← | ← | ← | ← | ← |
| | Silica filler (Aerosil R805, Nippon Aerosil Co., Ltd.) | ← | ← | ← | ← | ← | ← |
| | Liquid epoxy resin (jER828, Mitsubishi Chemical Corp.) | ← | ← | ← | ← | ← | ← |
| | Silane coupling agent (KBM-403, Shin-Etsu Chemical Co., Ltd.) | ← | ← | ← | ← | ← | ← |
| | Encapsulated imidazole-based curing agent (Novacure HX3941HP, Asahi Kasei Corporation) | — | — | — | — | — | — |
| | Thermal cationic polymerization initiator (SI-60L, Sanshin Chemical Industry Co., Ltd.) | ← | ← | ← | ← | ← | ← |
| Third insulating resin layer (tack layer) | Phenoxy resin (YP-50, Nippon Steel & Sumikin Chemical Co., Ltd.) | — | — | — | — | — | — |
| | Silica filler (Aerosil R805, Nippon Aerosil Co., Ltd.) | — | — | — | — | — | — |
| | Liquid epoxy resin (jER828, Mitsubishi Chemical Corp.) | — | — | — | — | — | — |
| | Silane coupling agent (KBM-403, Shin-Etsu Chemical Co., Ltd.) | — | — | — | — | — | — |

TABLE 1-continued

| | | | | | | |
|---|---|---|---|---|---|---|
| Thermal cationic polymerization initiator (SI-60L, Sanshin Chemical Industry Co., Ltd.) | — | — | — | — | — | — |

Meanwhile, molds were fabricated such that with the conductive particles (average particle diameter of 3 μm) of the first conductive particle layer arranged in the square lattice arrangement illustrated in FIG. 1A in a plan view, the surface density of the conductive particles was 800 particles/mm$^2$ (Examples 1A and 1B) for FOG as shown in Table 2, or 10000, 20000 or 30000 particles/mm$^2$ (Examples 2 to 8) for COG as shown in Table 3. That is, molds were fabricated with a convex portion pattern of the mold being arranged in a square lattice arrangement such that the angle θ formed by a lattice axis and the short-side direction of the anisotropic conductive film was 15°, known transparent resin pellets were melted and, while melted, poured into the molds, and the melted transparent resin was cooled and allowed to harden, and thereby resin molds including concave portions in the arrangement pattern illustrated in FIG. 1A were formed in a roll shape.

The concave portion of each resin mold was filled with conductive particles (AUL703 from Sekisui Chemical Co., Ltd., average particle diameter of 3 μm), and then covered with the above-described first insulating resin layer (layer A), after which a pressurizing roll was used to press at 0.5 MPa and a temperature of 60° C., and thereby the conductive particles were adhered across a length of 300 m from one end of the first insulating resin layer to the other end. The first insulating resin layer (layer A) was then detached from the mold, and the conductive particles on the first insulating resin layer (layer A) were pushed into the first insulating resin layer (layer A) using a pressurizing roll (pressing conditions: 70° C., 0.5 MPa), and the first conductive particle layer was formed. The embedding percentage was set to 100% such that the conductive particles were flush with the surface of the first insulating resin layer (layer A). Concaves with respect to a tangent plane of the first insulating resin layer to a central portion between adjacent conductive particles were formed around the pushed-in conductive particles.

Next, the second insulating resin layer (layer N) was bonded through heating and pressurizing (45° C., 0.5 MPa) to the surface of the first insulating resin layer (layer A) into which the conductive particles were pushed, and similar to the above description, the second conductive particle layer was formed on the surface of the opposite surface thereof by adhering conductive particles across a length of 300 m and pushing the conductive particles in the surface, and a conductive particle dispersed-layer was thereby obtained. In this case, the conductive particles (first conductive particle layer) that were pushed in first, and the conductive particles (second conductive particle layer) that were pushed in later, were shifted 3 μm in the film short-side direction. The travel direction of the first insulating resin layer to which the conductive particles were adhered was reversed compared to the case of forming the first conductive particle layer. In the case of forming the second conductive particle layer as well, the embedding percentage was set to 100% such that the conductive particles were flush with the surface of the first insulating resin layer (layer A). Concaves with respect to a tangent plane of the first insulating resin layer to a central portion between adjacent conductive particles were formed around the pushed-in conductive particles.

In each of Examples 1A, 2, 3, 4, 6, 7 and 8, the conductive particle dispersed-layer obtained as described above was formed into an anisotropic conductive film. In Example 1B, the film travel direction when adhering the conductive particles that become the first conductive particle layer to the first insulating resin layer, and the film travel direction when adhering the conductive particles that become the second conductive particle layer to the first insulating resin layer were made equivalent.

In Example 5, the third insulating resin layer (tack layer) was bonded through heating and pressurization (45° C., 0.5 MPa) to the surface of the conductive particle dispersed-layer on the side opposite the second insulating resin layer (layer N).

Within a 300 m long area from one end to the other end of the anisotropic conductive film of each example, rectangular areas with one side having 200 μm were established at 10 locations at different positions in the long-side direction as areas for measuring the number density of the conductive particles, and in these measurement areas, the first conductive particle layer and the second conductive particle layer were observed with a metallurgical microscope, the number density of conductive particles in each conductive particle layer was determined, and the variation trend of the conductive particle number density from the one end to the other end (trend of increase or decrease) was examined. The results are shown in Tables 2 and 3.

(1-2) Comparative Examples 1 to 3

Similar to Example 1, a first insulating resin layer (layer A), a second insulating resin layer (layer N), and a third insulating resin layer (tack layer) were formed of the resin compositions shown in Table 1.

In Comparative Example 1, the conductive particles were uniformly dispersed in the resin composition for forming the first insulating resin layer (layer A), and this was then coated onto a PET film, and dried to thereby form a conductive particle dispersed-layer in which conductive particles were singly dispersed at a surface density of 40000 particles/mm$^2$.

In Comparative Example 2, an anisotropic conductive film was manufactured in the same manner as Example 2 with the exception that as the conductive particle layer, only the first conductive particle layer that becomes the side of the second insulating resin layer (layer N) was formed at a surface density of 40000 particles/mm$^2$.

In Comparative Example 3, an anisotropic conductive film was manufactured in the same manner as Example 2 with the exception that as the conductive particle layer, only the second conductive particle layer that becomes the side opposite the second insulating resin layer (layer N) was formed at a surface density of 40000 particles/mm$^2$.

The variation trend of the conductive particle number density from the one end to the other end (trend of increase or decrease) was examined for each of the anisotropic conductive films of Comparative Examples 1 to 3 as well. The results are shown in Tables 2 and 3.

(2) Evaluation

Each of the anisotropic conductive films of the examples and comparative examples that were prepared in (1) was cut with sufficient surface area for connection, and in the following manner, the (a) initial conduction resistance, (b) conduction resistance after reliability testing, (c) particle capturing performance, (d) short circuit occurrence rate, and (e) temporary pressure bonding performance were measured or evaluated. The results are shown in Tables 2 and 3.

In this case, as the samples that were supplied for the evaluations, for Example 1A and Example 1B (anisotropic conductive films for FOG), one end and the other end in the long-side direction of the 300 m long anisotropic conductive films were used, and for Examples 2 to 8 and Comparative Examples 1 to 3 (anisotropic conductive films for COG), an intermediate portion (a 150 m portion from one end) in the long-side direction of the anisotropic conductive films was used.

(a) Initial Conduction Resistance (a1) Evaluation of the Conduction Property of Anisotropic Conductive Films for FOG (Examples 1A and 1B)

A sample of the anisotropic conductive film was sandwiched between a flexible printed circuit board (FPC) for evaluating the conduction property and a glass substrate, and then heated and pressurized (200° C., 5 MPa, 5 seconds) with a tool width of 1.5 mm to obtain each connected object for evaluation, and the conduction resistance of each of the obtained connected object for evaluation was measured. From a practical standpoint, the initial conduction resistance is desirably 1Ω or less. Therefore, an initial conduction resistance of 1Ω or less was considered to be OK, and an initial conduction resistance that exceeded 1Ω was considered to be NG.

Here, the terminal patterns of the FPC for evaluation and glass substrate corresponded to each other, and the sizes thereof were as described below. In addition, when connecting the FPC for evaluation and the glass substrate, the long-side direction of the anisotropic conductive film and the short-side direction of the terminals were aligned.

FPC for Evaluating the Conduction Property
 Terminal pitch: 50 μm
 Terminal width: Space between terminals=1:1
 Polyimide film thickness (PI)/copper foil thickness (Cu)=38/8, Sn plating Glass Substrate
 Electrode: ITO coating
 Thickness: 0.7 mm (a2) Evaluation of the Conduction Property of Anisotropic Conductive Films for COG (Examples 2 to 8, Comparative Examples 1 to 3)

A sample of each anisotropic conductive film was sandwiched between an IC for evaluating the conduction property and a glass substrate, and then heated and pressurized (180° C., 80 MPa, 5 seconds) to obtain respective connected objects for evaluation, and the conduction resistance of each obtained connected object for evaluation was measured. From a practical standpoint, the initial conduction resistance is desirably 1Ω or less. Therefore, an initial conduction resistance of 1Ω or less was evaluated as OK, and an initial conduction resistance that exceeded 1Ω was evaluated as NG.

Here, the terminal patterns of the IC for evaluation and glass substrate corresponded to each other, and sizes thereof were as described below. In addition, when connecting the IC for evaluation and the glass substrate, the long-side direction of the anisotropic conductive film and the short-side direction of the bumps were aligned.

IC for Evaluating the Conduction Property
 Outer shape: 1.8×20.0 mm
 Thickness: 0.5 mm
 Bump specifications: size of 30×85 μm; distance between bumps of 50 μm; bump height of 15 μm Glass Substrate
 Glass material: 1737F manufactured by Corning Inc.
 Outer shape: 30×50 mm
 Thickness: 0.5 mm
 Electrode: ITO wiring (b) Conduction Resistance after Reliability Testing In the same manner as with the initial conduction resistance, the conduction resistance of each of the connected objects for evaluation that were fabricated in (a) was measured after the objects were placed in a thermostatic chamber at a temperature of 85° C. and a humidity of 85% RH for 500 hours. The conduction resistance after reliability testing is desirably 6Ω or less from a practical standpoint. Therefore, a conduction resistance of 6Ω or less after reliability testing was evaluated as OK, and a conduction resistance that exceeded 6Ω after reliability testing was evaluated as NG.

(c) Particle Capturing Performance (c1) Evaluation of the Particle Capturing Performance of Anisotropic Conductive Films for FOG (Examples 1A and 1B)

With respect to the connected object for evaluating the conduction property, the number of conductive particles that were captured by 100 terminals in an area of 25×400 μm from amongst the FPC terminals of the connection portion, was measured, and the minimum captured quantity was determined and evaluated based on the following criteria.

A (good): 3 or more
 B (no problem for practical applications): less than 3

(c2) Evaluation of the Particle Capturing Performance of Anisotropic Conductive Films for COG (Examples 2 to 8, Comparative Examples 1 to 3)

An IC for evaluating the particle capturing performance was used, this IC for evaluation and a glass substrate including a corresponding terminal pattern were aligned with a shifting of 6 μm, and then heated and pressurized (180° C., 80 MPa, 5 seconds), and the number of conductive particles that were captured by 100 terminals in a 6 μm×66.6 μm area in which the bumps of the IC for evaluation and the terminals of the substrate overlapped was measured, and the minimum captured quantity was determined and evaluated based on the following criteria. From a practical standpoint, an evaluation of B or higher is preferable.

IC for Evaluating the Particle Capturing Performance
 Outer shape: 1.6×29.8 mm
 Thickness: 0.3 mm
 Bump specifications: size of 12×66.6 μm; bump pitch of 22 μm; bump height of 12 μm Particle Capturing Performance Evaluation Criteria
 A (good): 5 or more particles
 B (no problem for practical applications): from 3 particles to less than 5 particles
 C (poor): less than 3 particles (d) Short Circuit Occurrence Rate (d-1) Evaluation of the Short Circuit Occurrence Rate of Anisotropic Conductive Films for FOG (Examples 1A and 1B)

An FPC that was the same as the FPC for evaluating the conduction property was heated and pressurized (200° C., 5 MPa, 5 seconds) to a non-alkaline glass (thickness of 0.7 mm), the number of short circuits of the obtained connected object for evaluation was measured, and the short circuit occurrence rate was determined from the measured number of short circuits and number of gaps of the connected object for evaluation, and was evaluated based on the following criteria.

A (good): less than 50 ppm
 B (no problem for practical applications): from 50 ppm to less than 200 ppm
 C (poor): 200 ppm or greater (d-2) Evaluation of the Short Circuit Occurrence Rate of Anisotropic Conductive Films for COG (Examples 2 to 8, Comparative Examples 1 to 3)

Using an IC for evaluating the short circuit occurrence rate, a connected object for evaluation was obtained in the same manner as in the evaluation of the (a) initial conduction resistance, the number of short circuits in the obtained connected object for evaluation was measured, and the short circuit occurrence rate was determined from the measured number of short circuits and number of gaps of the connected object for evaluation, and was evaluated based on the following criteria.

IC for Evaluating the Short Circuit Occurrence Rate (Comb-Shaped Test Element Group (TEG) with Spacing of 7.5 μm))
    Outer shape: 15×13 mm
    Thickness: 0.5 mm
    Bump specifications: size of 25×140 μm; distance between bumps of 7.5 μm; bump height of 15 μm Short Circuit Occurrence Rate Evaluation Criteria
    A: less than 50 ppm
    B: from 50 ppm to less than 200 ppm
    C: 200 ppm or greater (e) Temporary Pressure Bonding Performance Using a pressure bonding tool, an anisotropic conductive film (width of 1.5 mm, length of 50 mm) with a PET film was temporarily pressure bonded to an ITO glass through pressing at a temperature of 60° C. or 70° C. and a pressure bonding pressure of 1 MPa with a pressure bonding time of 1 second. In this case, 350 μm thick silicone rubber was interposed as a cushioning material between the pressure bonding tool and the PET film. The PET film was detached from 100 temporarily pressure bonded samples for which the anisotropic conductive film was pressed onto an ITO glass in this manner. When doing so, the outcome of the temporary pressure bonding was conveniently determined to be OK when not even one anisotropic conductive film detached along with the PET film from the ITO glass, and to be NG when even one anisotropic conductive film detached along with the PET film from the ITO glass.

A: OK at 60° C. or greater
    B: OK at 70° C. or greater
    C: NG at 70° C. or greater

TABLE 2

| | Anisotropic Conductive Film for FOG | Example 1A | | Example 1B | |
|---|---|---|---|---|---|
| Designed Conductive Particle Density (particles/mm$^2$) | First conductive particle layer (layer N side) | 800 | | 800 | |
| | Second conductive particle layer (side opposite the layer N) | 800 | | 800 | |
| Embedding percentage (%) | | 100 | | 100 | |
| Layer thickness (μm) | Second insulating resin layer (layer N) | 13 | | 13 | |
| | First insulating resin layer (layer A) | 5 | | 5 | |
| Number density variation trend from the one end to the other end in the long-side direction of the anisotropic conductive film | First conductive particle layer | Increases | | Increases | |
| | Second conductive particle layer | Decreases | | Increases | |
| Evaluation | Evaluation position (Distance in long-side direction from one end) (m) | 0 | 300 | 0 | 300 |
| | Conduction resistance (initial) | OK | OK | OK | OK |
| | Conduction resistance (after reliability testing) (85° C., 85% RH, 500 h) | OK | OK | OK | OK |
| | Particle capturing performance | A | A | B | A |
| | Short circuit occurrence rate | A | A | A | A |
| | Temporary pressure bonding performance | A | A | A | A |

TABLE 3

| Anisotropic Conductive Film for COG | | Example 2 | Example 3 | Example 4 | Example 5 | Example 6 |
|---|---|---|---|---|---|---|
| Designed Conductive Particle Density (particles/mm$^2$) | Second conductive particle layer (side opposite the layer N) | 20000 | 20000 | 20000 | 20000 | 30000 |
| | First conductive particle layer (layer N side) | 20000 | 20000 | 20000 | 20000 | 10000 |
| Embedding percentage (%) | | 100 | 100 | 100 | 100 | 100 |
| Layer thickness (μm) | Second insulating resin layer (layer N) | 13 | 13 | 13 | 11 | 13 |
| | First insulating resin layer (layer A) | 5 | 5 | 5 | 5 | 5 |
| | Third insulating resin layer (tack layer) | — | — | — | 2 | — |
| Melt viscosity of each layer | Second insulating resin layer (layer N) | 800 | 800 | 1400 | 800 | 800 |
| | First insulating resin layer (layer A) | 5000 | 2000 | 5000 | 5000 | 5000 |
| | Third insulating resin layer (tack layer) | — | — | — | 650 | — |

TABLE 3-continued

| | | | | | | |
|---|---|---|---|---|---|---|
| Number density variation trend from the one end to the other end in the long-side direction of the anisotropic conductive film | First conductive particle layer | Increases | Increases | Increases | Increases | Increases |
| | Second conductive particle layer | Decreases | Decreases | Decreases | Decreases | Decreases |
| Evaluation | Evaluation position (Distance in long-side direction from one end) (m) | 150 | ← | ← | ← | ← |
| | Conduction resistance (initial) | OK | OK | OK | OK | OK |
| | Conduction resistance (85° C., 85% RH, 500 h) | OK | OK | OK | OK | OK |
| | Particle capturing performance | A | B | A | B | A |
| | Short circuit occurrence rate | A | A | A | A | A |
| | Temporary pressure bonding performance | A | A | A | A | B |

| Anisotropic Conductive Film for COG | | Example 7 | Example 8 | Comparative Example 1 | Comparative Example 2 | Comparative Example 3 |
|---|---|---|---|---|---|---|
| Designed Conductive Particle Density (particles/mm$^2$) | Second conductive particle layer (side opposite the layer N) | 10000 | 30000 | Single dispersion in layer A (40000) | — | 40000 |
| | First conductive particle layer (layer N side) | 30000 | 30000 | | 40000 | — |
| Embedding percentage (%) | | 100 | 100 | 100 | 100 | 100 |
| Layer thickness (μm) | Second insulating resin layer (layer N) | 13 | 13 | 13 | 13 | 13 |
| | First insulating resin layer (layer A) | 5 | 5 | 5 | 5 | 5 |
| | Third insulating resin layer (tack layer) | — | — | — | — | — |
| Melt viscosity of each layer | Second insulating resin layer (layer N) | 800 | 800 | 800 | 800 | 800 |
| | First insulating resin layer (layer A) | 5000 | 5000 | 5000 | 5000 | 5000 |
| | Third insulating resin layer (tack layer) | — | — | — | — | — |
| Number density variation trend from the one end to the other end in the long-side direction of the anisotropic conductive film | First conductive particle layer | Increases | Increases | — | Increases | — |
| | Second conductive particle layer | Decreases | Decreases | — | — | Decreases |
| Evaluation | Evaluation position (Distance in long-side direction from one end) (m) | ← | ← | ← | ← | ← |
| | Conduction resistance (initial) | OK | OK | OK | OK | OK |
| | Conduction resistance (85° C., 85% RH, 500 h) | OK | OK | OK | OK | OK |
| | Particle capturing performance | B | A | C | C | A |
| | Short circuit occurrence rate | A | B | C | B | B |
| | Temporary pressure bonding performance | A | B | A | A | C(*) |

(*)At 75° C., detachment of the anisotropic conductive film did not occur even with 500 samples.

As shown in Table 2, in Example 1A, the conductive particles were embedded at an embedding percentage of 100% respectively into the front and rear surfaces of the insulating resin layer, and the increasing and decreasing trends in the conductive particle number density from the one end to the other end in the long-side direction of the anisotropic conductive film are in reverse directions between the first conductive particle layer and the second conductive particle layer, and at both the one end and the other end of the anisotropic conductive film, Example 1A obtained good evaluations for each of the evaluation areas of conduction resistance, conduction resistance reliability, particle capturing performance, short circuit occurrence rate, and temporary pressure bonding performance. In contrast, in Example 1B, the increasing and decreasing trends in the number density were made uniform between the first conductive particle layer and the second conductive particle layer, and at one end of the film where the conductive particle number density of the combined first conductive particle layer and second conductive particle layer was reduced, a portion where the particle capturing performance was inferior existed, and at the other end of the film where the number density increased, a good evaluation including particle capturing performance was obtained. Note that in this evaluation, because of the sufficient connection surface area, it was determined that there would be no problem for practical applications even with an evaluation of B for capturing of less than 3 particles.

As shown in Table 3, with the anisotropic conductive films of Examples 2 to 8 as well, the conductive particles were embedded with an embedding percentage of 100% respectively into the front and rear surfaces of the insulating resin layer, the increasing and decreasing trends of the conductive particle in the long-side direction of the anisotropic conductive films were in reverse directions between the first conductive particle layer and the second conductive particle layer, and good results were obtained with each of the evaluation items. In particular, from Examples 2 and 5, it is clear that the anisotropic conductive films of the present invention exhibit good temporary bonding performance and excel in operability even without a tack layer, and also excel in particle capturing performance.

From Comparative Example 1, it is clear that when conductive particles are singly dispersed in the conductive particle dispersed-layer, the resulting film is inferior in both particle capturing performance and short circuit occurrence rate. From Comparative Example 2, it is understood that when the conductive particle layer is formed only at the second insulating resin layer (layer N) side, the particle capturing performance is inferior, and from Comparative Example 3, it is understood that when the conductive particle layer is formed only at the side that is opposite the second insulating resin layer (layer N), the resulting film is inferior in temporary pressure bonding performance. Note that in Comparative Example 3, when the temporary pressure bonding temperature was set to 75° C., even with 500 temporary pressure bonding samples, detachment of the anisotropic conductive film from the ITO glass did not occur, and therefore it is found that depending on the setting of the temporary pressure bonding temperature, Comparative Example 3 can be supplied for actual use.

(3) Transfer Rate

Regarding the anisotropic conductive film of Example 1, the transfer rate of the conductive particles when the first conductive particle layer was formed (first time), and the transfer rate of the conductive particles when the second conductive particle layer was formed (second time) were each measured.

Here, the transfer rate is a percentage of the number of conductive particles transferred to the first insulating resin layer with respect to the number of conductive particles that were filled into the resin mold.

To measure the transfer rate, the number of conductive particles of the first conductive particle layer or the second conductive particle layer that are present in a surface area of 1 mm$^2$ at length positions of 0 m, 50 m, 100 m, 200 m, and 300 m of the anisotropic conductive film was measured using a metallurgical microscope, and the average thereof was calculated. Note that the first conductive particle layer (first time) was formed by transferring conductive particles in a direction from the 0 m side to the 300 m side of the anisotropic conductive film, and the second conductive particle layer (second time) was formed by transferring conductive particles in a direction from the 300 m side to the 0 m side of the anisotropic conductive film.

As a result, the transfer rate from the transfer start point to 100 m exceeded 99.9% with both the first conductive particle layer and the second conductive particle layer, but as the transfer progressed, the transfer rate decreased. However, the transfer rate of the combined first conductive particle layer and second conductive particle layer exceeded 99.9% at each position from the transfer start point to 300 m.

REFERENCE SIGNS LIST 1A, 1B Filler
1C, 1C$_1$, 1C$_2$ Filler unit
2 Resin layer
2a, 2b Surface of resin layer
2x Concave
2y Concave
3 Filler dispersed-layer
4 Second resin layer
10, 10A, 10B, 10C, 10D, 10E, 10F, 10G Filler-containing film of the example
10Ap One end of the filler-containing film
10Aq Other end of the filler-containing film
20, 21 Terminal
30 First electronic component
31 Second electronic component
A Lattice axis of filler arrangement
DA, DB Particle diameter
La Layer thickness of resin layer
L1, L2 Embedded amount
L3 Minimum interparticle spacing between fillers in the first filler layer
L4 Minimum interparticle spacing between fillers in the second filler layer
Lc Diameter of exposed portion of filler
Ld Maximum diameter of concave (incline)
Le Maximum depth of concave (incline)
Lf Maximum depth of concave (undulation)
θ Angle formed by the long-side direction of the terminal and the lattice axis of the conductive particle arrangement

The invention claimed is:

1. A filler-containing film including a filler dispersed-layer comprising:
a resin layer;
a first filler layer comprising a first filler dispersed in a single layer in the resin layer; and
a second filler layer comprising a second filler dispersed in a single layer in the resin layer at a depth different from the depth of the first filler layer; wherein
the first filler present in the first filler layer is exposed at a first surface of the resin layer, or is in close proximity to the first surface;
the second filler present in the second filler layer is exposed at a second surface of the resin layer, which is opposite the first surface, or is in close proximity to the second surface; and
when one of a number density of the first filler present in the first filler layer and a number density of the second filler present in the second filler layer increases or decreases along a long-side direction of the filler-containing film, the other respectively decreases or increases along the long-side direction of the filler-containing film.

2. The filler-containing film according to claim 1, wherein a ratio La/D of a layer thickness La of the resin layer to an average particle diameter D of the filler is from 0.6 to 10.

3. The filler-containing film according to claim 1, wherein fillers present in the first filler layer or fillers present in the second filler layer are in contact or in close proximity to form filler units,
the filler units do not contact each other, and
the filler units are regularly arranged.

4. The filler-containing film according to claim 1, wherein fillers present in the first filler layer and fillers present in the second filler layer are in contact or in close proximity to form filler units,
the filler units do not contact each other, and
the filler units are regularly arranged.

5. The filler-containing film according to claim 3, wherein a long-side direction of the filler units present in the first filler layer, and a long-side direction of the filler units present in the second filler layer are non-parallel in a plan view.

6. The filler-containing film according to claim 1, further comprising
a second resin layer laminated onto the filler dispersed-layer, wherein
a minimum melt viscosity of the second resin layer is lower than a minimum melt viscosity of the resin layer of the filler dispersed-layer.

7. The filler-containing film according to claim 1, wherein
a surface of the resin layer in the vicinity of the first filler or the second filler has inclines or undulations with respect to a tangent plane of the resin layer to a central portion between adjacent fillers,
if the inclines are present, resin is absent from a region between the inclines and the tangent plane, and
if the undulations are present, an amount of resin of the resin layer directly above the first filler or the second filler is less as compared to a case where the surface of the resin layer directly above the first filler or the second filler is located in the tangent plane.

8. The filler-containing film according to claim 1, wherein
the first filler and the second filler are conductive particles,
the resin layer is an insulating resin layer, and
the filler-containing film is an anisotropic conductive film.

9. A method for manufacturing the filler-containing film according to claim 1, the method comprising:
adhering the first filler in a first prescribed dispersed state on the first surface of the resin layer;
pushing the first filler into the resin layer;
adhering the second filler in a second prescribed dispersed state on the second surface of the resin layer; and
pushing the second filler into the resin layer.

10. A method for manufacturing the filler-containing film according to claim 1, the first filler and the second filler being conductive particles, the resin layer being an insulating resin layer, and the filler-containing film being an anisotropic conductive film, the method comprising:
adhering the first filler in a first prescribed dispersed state on the first surface of the resin layer;
pushing the first filler into the resin layer;
adhering the second filler in a second prescribed dispersed state on the second surface of the resin layer; and
pushing the second filler into the resin layer.

11. The manufacturing method according to claim 9, wherein when the first filler and the second filler are adhered in the respective prescribed dispersed states on both surfaces of the resin layer, the method further comprises:
adhering the first filler sequentially from a first end of the resin layer to a second end of the resin layer, and
adhering the second filler sequentially from the second end of the resin layer to the first end of the resin layer.

12. A film adhered body, comprising an article adhered to the filler-containing film according to claim 1.

13. A connection structure, comprising a first article and a second article that are connected via the filler-containing film according to claim 1.

14. The connection structure according to claim 13, wherein
the first article is a first electronic component,
the second article is a second electronic component,
the first electronic component and the second electronic component are connected in an anisotropic conductive manner via the filler-containing film, wherein the filler-containing film is an anisotropic conductive film having conductive particles as the first filler and the second filler, and the resin layer is an insulating resin layer.

15. A method for manufacturing a connection structure, the method comprising:
pressure bonding a first article and a second article via the filler-containing film according to claim 1.

16. A method for manufacturing the connection structure according to claim 14, the method comprising:
providing the first electronic component and the second electronic component as the first article and the second article, respectively; and
thermocompression bonding the first electronic component and the second electronic component via the filler-containing film to manufacture the connection structure, wherein:
in the connection structure, the first electronic component and the second electronic component are connected in an anisotropic conductive manner,
the filler-containing film is an anisotropic conductive film having conductive particles as the first filler and the second filler, and
the resin layer is an insulating resin layer.

17. The filler-containing film according to claim 1, wherein when one of the number density of the first filler present in the first filler layer and the number density of the second filler present in the second filler layer increases gradually or decreases gradually along the long-side direction of the filler-containing film, the other respectively decreases gradually or increases gradually along the long-side direction of the filler-containing film.

* * * * *